(12) United States Patent
Takao et al.

(10) Patent No.: US 12,237,248 B2
(45) Date of Patent: Feb. 25, 2025

(54) SEMICONDUCTOR DEVICE AND METHOD FOR MANUFACTURE OF SEMICONDUCTOR DEVICE

(71) Applicant: AOI Electronics Co., Ltd., Takamatsu (JP)

(72) Inventors: Katsuhiro Takao, Takamatsu (JP); Takashi Suzuki, Takamatsu (JP)

(73) Assignee: AOI Electronics Co., Ltd., Takamatsu-Kagawa (JP)

( * ) Notice: Subject to any disclaimer, the term of this patent is extended or adjusted under 35 U.S.C. 154(b) by 596 days.

(21) Appl. No.: 17/595,333

(22) PCT Filed: Sep. 25, 2019

(86) PCT No.: PCT/JP2019/037699
§ 371 (c)(1),
(2) Date: Nov. 15, 2021

(87) PCT Pub. No.: WO2020/240882
PCT Pub. Date: Dec. 3, 2020

(65) Prior Publication Data
US 2022/0216135 A1 Jul. 7, 2022

(30) Foreign Application Priority Data
May 31, 2019 (JP) .................. 2019-103206

(51) Int. Cl.
*H01L 23/495* (2006.01)
*H01L 21/48* (2006.01)
(Continued)

(52) U.S. Cl.
CPC .... *H01L 23/49575* (2013.01); *H01L 21/4803* (2013.01); *H01L 21/4828* (2013.01);
(Continued)

(58) Field of Classification Search
CPC ......... H01L 21/56–568; H01L 2924/181–186; H01L 23/28–3192
See application file for complete search history.

(56) References Cited

U.S. PATENT DOCUMENTS

| 5,847,458 A | 12/1998 | Nakamura et al. |
| 2004/0124512 A1* | 7/2004 | Tao ..................... H01L 25/0655 257/E23.105 |

(Continued)

FOREIGN PATENT DOCUMENTS

| JP | 9-321173 A | 12/1997 |
| JP | 10-178246 A | 6/1998 |

(Continued)

OTHER PUBLICATIONS

International Search Report (PCT/ISA/210) issued in PCT Application No. PCT/JP2019/037699 dated Dec. 17, 2019 with English translation (four (4) pages).

Japanese-language Written Opinion (PCT/ISA/237) issued in PCT Application No. PCT/JP2019/037699 dated Dec. 17, 2019 (three (3) pages).

*Primary Examiner* — Scott B Geyer
*Assistant Examiner* — Cole Leon Lindsey
(74) *Attorney, Agent, or Firm* — Crowell & Moring LLP

(57) ABSTRACT

A semiconductor device includes at least one first semiconductor element having a first electrode, a second semiconductor element having a second electrode, a first lead terminal connected to the first electrode of the at least one first semiconductor element, a second lead terminal connected to the second electrode of the second semiconductor element, a first resin with which the first lead terminal and the second lead terminal are sealed, and a second resin with which the at least one first semiconductor element and the second semiconductor element are sealed.

17 Claims, 20 Drawing Sheets

(51) Int. Cl.
*H01L 23/00* (2006.01)
*H01L 23/31* (2006.01)
*H01L 25/00* (2006.01)
*H01L 25/16* (2023.01)
*H02M 7/5387* (2007.01)

(52) U.S. Cl.
CPC .... *H01L 23/3121* (2013.01); *H01L 23/49558* (2013.01); *H01L 23/49562* (2013.01); *H01L 25/16* (2013.01); *H01L 25/50* (2013.01); *H02M 7/5387* (2013.01); *H01L 24/32* (2013.01); *H01L 24/40* (2013.01); *H01L 24/92* (2013.01); *H01L 2224/32245* (2013.01); *H01L 2224/40139* (2013.01); *H01L 2224/40245* (2013.01); *H01L 2224/92246* (2013.01); *H01L 2924/13091* (2013.01); *H01L 2924/1426* (2013.01)

(56) References Cited

U.S. PATENT DOCUMENTS

| | | | |
|---|---|---|---|
| 2005/0260796 A1 | 11/2005 | Takahashi | |
| 2008/0029906 A1* | 2/2008 | Otremba | H01L 23/3121 |
| | | | 257/E21.705 |
| 2016/0104688 A1* | 4/2016 | Cho | H01L 27/0623 |
| | | | 257/676 |

FOREIGN PATENT DOCUMENTS

| | | |
|---|---|---|
| JP | 2005-332999 A | 12/2005 |
| JP | 2009-147117 A | 7/2009 |
| JP | 2015-109295 A | 6/2015 |

* cited by examiner (A)

(B)

(A)

(B)

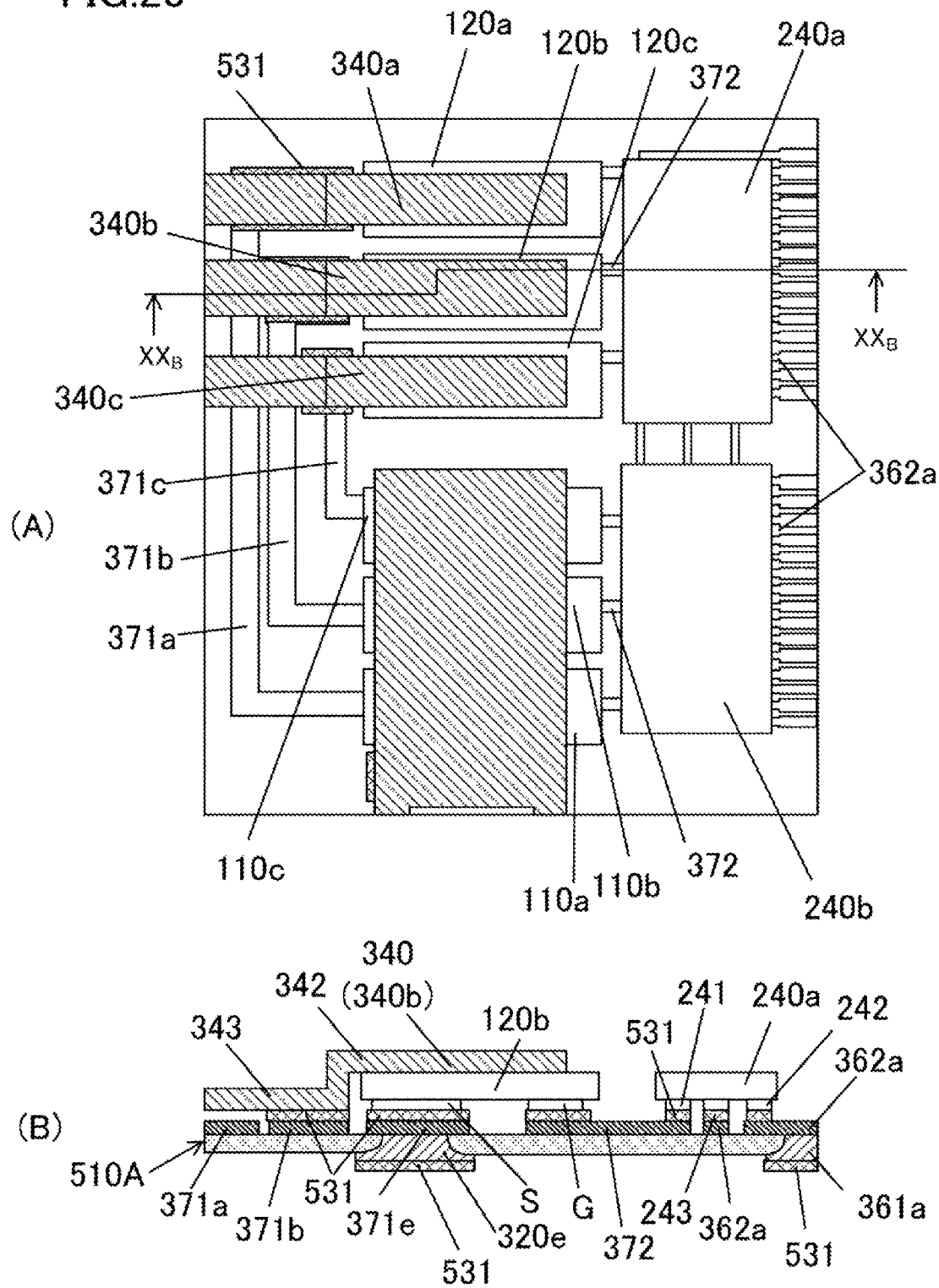

SEMICONDUCTOR DEVICE AND METHOD FOR MANUFACTURE OF SEMICONDUCTOR DEVICE

TECHNICAL FIELD

The present invention relates to a semiconductor device and a method for manufacture of the semiconductor device.

BACKGROUND ART

Semiconductor devices are known in which electronic components are coupled to lead terminals formed of a lead frame and are sealed with resin. Patent Literature 1 discloses a semiconductor device in which two MOS FETs and a driver IC are coupled to lead terminals formed of a lead frame and are wholly sealed with resin.

CITATION LIST

Patent Literature

Patent Literature 1: U.S. Patent Application Publication No. 2016/0104688 Specification

SUMMARY

Technical Problem

The semiconductor device described in Patent Literature 1 has a structure in which the MOS FETs, the driver IC, the lead terminals, and bonding wires are sealed with the resin in a lump. Accordingly, before the resin sealing, the lead frame is required to be cut by etching for the lead terminals to be separated from each other in a state where one electrode of each MOS FET and one electrode of the driver IC are coupled to the lead frame and another electrode of each MOS FET is connected to the lead frame by a bonding wire. Therefore, it is difficult to enhance productivity of the semiconductor device described in Patent Literature 1.

Solution to Problem

According to a first aspect of the present invention, a semiconductor device includes at least one first semiconductor element having a first electrode, a second semiconductor element having a second electrode, a first lead terminal connected to the first electrode of the at least one first semiconductor element, a second lead terminal connected to the second electrode of the second semiconductor element, a first resin with which the first lead terminal and the second lead terminal are sealed, and a second resin with which the at least one first semiconductor element and the second semiconductor element are sealed.

According to a second aspect of the present invention, it is preferable that the semiconductor device according to the first aspect further includes a connecting conductor held by the first resin. The at least one first semiconductor element has a third electrode. The second semiconductor element has a fourth electrode. The third electrode of the at least one first semiconductor element and the fourth electrode of the second semiconductor element are each connected to the connecting conductor.

According to a third aspect of the present invention, it is preferable that, in the semiconductor device according to the second aspect, the first lead terminal, the second lead terminal, and the connecting conductor are formed of a lead frame, and the connecting conductor is thinner than the first lead terminal.

According to a fourth aspect of the present invention, it is preferable that, in the semiconductor device according to the second aspect, the first lead terminal and the second lead terminal are formed of a lead frame, and the connecting conductor is formed by plating.

According to a fifth aspect of the present invention, it is preferable that, in the semiconductor device according to the second aspect, the first lead terminal is connected to a high potential part, the second lead terminal is connected to a low potential part, and the third electrode of the at least one first semiconductor element and the fourth electrode of the second semiconductor element are arranged between the first electrode of the at least one first semiconductor element coupled to the first lead terminal and the second electrode of the second semiconductor element coupled to the second lead terminal.

According to a sixth aspect of the present invention, it is preferable that, in the semiconductor device according to the second aspect, the first lead terminal, the second lead terminal, and the connecting conductor include copper or copper alloy.

According to a seventh aspect of the present invention, it is preferable that, in the semiconductor device according to the first aspect, the first lead terminal and the second lead terminal each have a lower surface at a side of opposite to a side where the at least one first semiconductor element and the second semiconductor element are arranged, at least a portion of the lower surface being exposed from the first resin.

According to an eighth aspect of the present invention, it is preferable that, in the semiconductor device according to the fifth aspect, the second lead terminal includes a connecting part coupled to the second electrode of the second semiconductor element and a mounting part exposed from the first resin, and the connecting part is thinner than the mounting part.

According to a ninth aspect of the present invention, it is preferable that, in the semiconductor device according to the first aspect, coupling plating layers formed of same material are individually provided between the first electrode of the at least one first semiconductor element and the first lead terminal, between the second electrode of the second semiconductor element and the second lead terminal, on a surface of the first lead terminal at a side opposite to a side where the first electrode of the at least one first semiconductor element is arranged, and on a surface of the second lead terminal at a side opposite to a side where the second electrode of the second semiconductor element is arranged.

According to a tenth aspect of the present invention, it is preferable that, in the semiconductor device according to the first aspect, a first coupling plating layer is provided between the first electrode of the at least one first semiconductor element and the first lead terminal and between the second electrode of the second semiconductor element and the second lead terminal, and a second coupling plating layer formed of different metal than the first coupling plating layer is provided on a surface of the first lead terminal at a side opposite to a side where the first electrode of the at least one first semiconductor element is arranged and on a surface of the second lead terminal at a side opposite to a side where the second electrode of the second semiconductor element is arranged.

According to an eleventh aspect of the present invention, it is preferable that the semiconductor device according to the second aspect further includes a conductive body. The at least one first semiconductor element has a fifth electrode at a side opposite to a side where the first electrode and the third electrode are arranged. The conductive body is connected to the fifth electrode.

According to a twelfth aspect of the present invention, it is preferable that, in the semiconductor device according to the eleventh aspect, the conductive body has an upper surface exposed from the second resin at a side opposite to a side where the at least one first semiconductor element is arranged.

According to a thirteenth aspect of the present invention, it is preferable that, in the semiconductor device according to the eleventh or twelfth aspect, the at least one first semiconductor element includes at least one pair of semiconductor elements, and the conductive body connects the fifth electrode of one of the at least one pair of semiconductor elements with the first electrode of the other of the at least one pair of semiconductor elements.

According to a fourteenth aspect of the present invention, it is preferable that, in the semiconductor device according to the thirteenth aspect, the at least one pair of semiconductor elements includes a plurality of pairs of semiconductor elements.

According to a fifteenth aspect of the present invention, it is preferable that, the semiconductor device according to the fourteenth aspect further includes a power converter configured to perform conversion of a direct current or an alternate current. The second semiconductor element is a control semiconductor element configured to control driving of the plurality of pairs of semiconductor elements. The plurality of pairs of semiconductor elements and the control semiconductor element constitute the power converter.

According to a sixteenth aspect of the present invention, a method for manufacture of a semiconductor device includes sealing a first lead terminal and a second lead terminal with a first resin to form a lead terminal sealing body, connecting a first electrode of a first semiconductor element with the first lead terminal of the lead terminal sealing body, connecting a second electrode of a second semiconductor element with the second lead terminal of the lead terminal sealing body, and sealing with a second resin the first semiconductor element, the second semiconductor element, and a surface of the lead terminal sealing body at a first and second semiconductor element side.

According to a seventeenth aspect of the present invention, it is preferable that, the method for manufacture of a semiconductor device according to the sixteenth aspect further includes forming a connecting conductor to be held by the first resin. The connecting conductor connects a third electrode of the first semiconductor element with a fourth electrode of the second semiconductor element.

According to an eighteenth aspect of the present invention, it is preferable that, in the method for manufacture of a semiconductor device according to the seventeenth aspect, the first lead terminal, the second lead terminal, and the connecting conductor are formed of a lead frame.

According to a nineteenth aspect of the present invention, it is preferable that, the method for manufacture of a semiconductor device according to the seventeenth aspect further includes forming a lead frame into the first lead terminal and the second lead terminal. The connecting conductor is formed by plating.

According to a twentieth aspect of the present invention, it is preferable that, the method for manufacture of a semiconductor device according to any one of the sixteenth to nineteenth aspects further includes forming coupling plating layers on both upper and lower surfaces of the first lead terminal and on both upper and lower surfaces of the second lead terminal before coupling the first electrode of the first semiconductor element to the first lead terminal of the lead terminal sealing body and before coupling the second electrode of the second semiconductor element to the second lead terminal of the lead terminal sealing body. An upper surface of the upper and lower surfaces of the first lead terminal is a surface to which the first electrode of the first semiconductor element is coupled, at a side opposite to a lower surface of the upper and lower surfaces of the first lead terminal. An upper surface of the upper and lower surfaces of the second lead terminal is a surface to which the second electrode of the second semiconductor element is coupled, at a side opposite to a lower surface of the upper and lower surfaces of the second lead terminal.

Advantageous Effects of Invention

According to the present invention, the lead terminals are sealed with the resin and, therefore, the productivity can be enhanced.

BRIEF DESCRIPTION OF DRAWINGS

FIG. 5(A) is a top view and FIG. 5(B) is a cross-sectional view taken along line VB-VB of FIG. 5(A);

FIG. 6(A) is a top view and FIG. 6(B) is a cross-sectional view taken along line VIB-VIB of FIG. 6(A);

FIG. 7(A) is a top view and FIG. 7(B) is a cross-sectional view taken along line VIIB-VIIB of FIG. 7(A);

FIG. 8(A) is a top view and FIG. 8(B) is a cross-sectional view taken along line VIIIB-VIIIB of FIG. 8(A);

FIG. 9(A) is a top view and FIG. 9(B) is a cross-sectional view taken along line IXB-IXB of FIG. 9(A);

FIG. 10(A) is a top view and FIG. 10(B) is a cross-sectional view taken along line XB-XB of FIG. 10(A);

FIG. 11(A) is a top view and FIG. 11(B) is a cross-sectional view taken along line XIB-XIB of FIG. 11(A);

FIG. 14(A) is a top view and FIG. 14(B) is a cross-sectional view taken along line XIVB-XIVB of FIG. 14(A);

FIG. 15(A) is a top view and FIG. 15(B) is a cross-sectional view taken along line XVB-XVB of FIG. 15(A);

FIG. 16(A) is a top view and FIG. 16(B) is a cross-sectional view taken along line XVIB-XVIB of FIG. 16(A);

FIG. 17(A) is a top view and FIG. 17(B) is a cross-sectional view taken along line XVIIB-XVIIB of FIG. 17(A);

FIG. 18(A) is a top view and FIG. 18(B) is a cross-sectional view taken along line XVIIIB-XVIIIB of FIG. 18(A);

FIG. 19(A) is a top view and FIG. 19(B) is a cross-sectional view taken along line XIXB-XIXB of FIG. 19(A); and FIG. 20 shows the method for manufacture of the semiconductor device subsequent to FIG. 19, where FIG. 20(A) is a top view and FIG. 20(B) is a cross-sectional view taken along line XXB-XXB of FIG. 20(A).

DESCRIPTION OF EMBODIMENTS

First Embodiment

Figure 1:
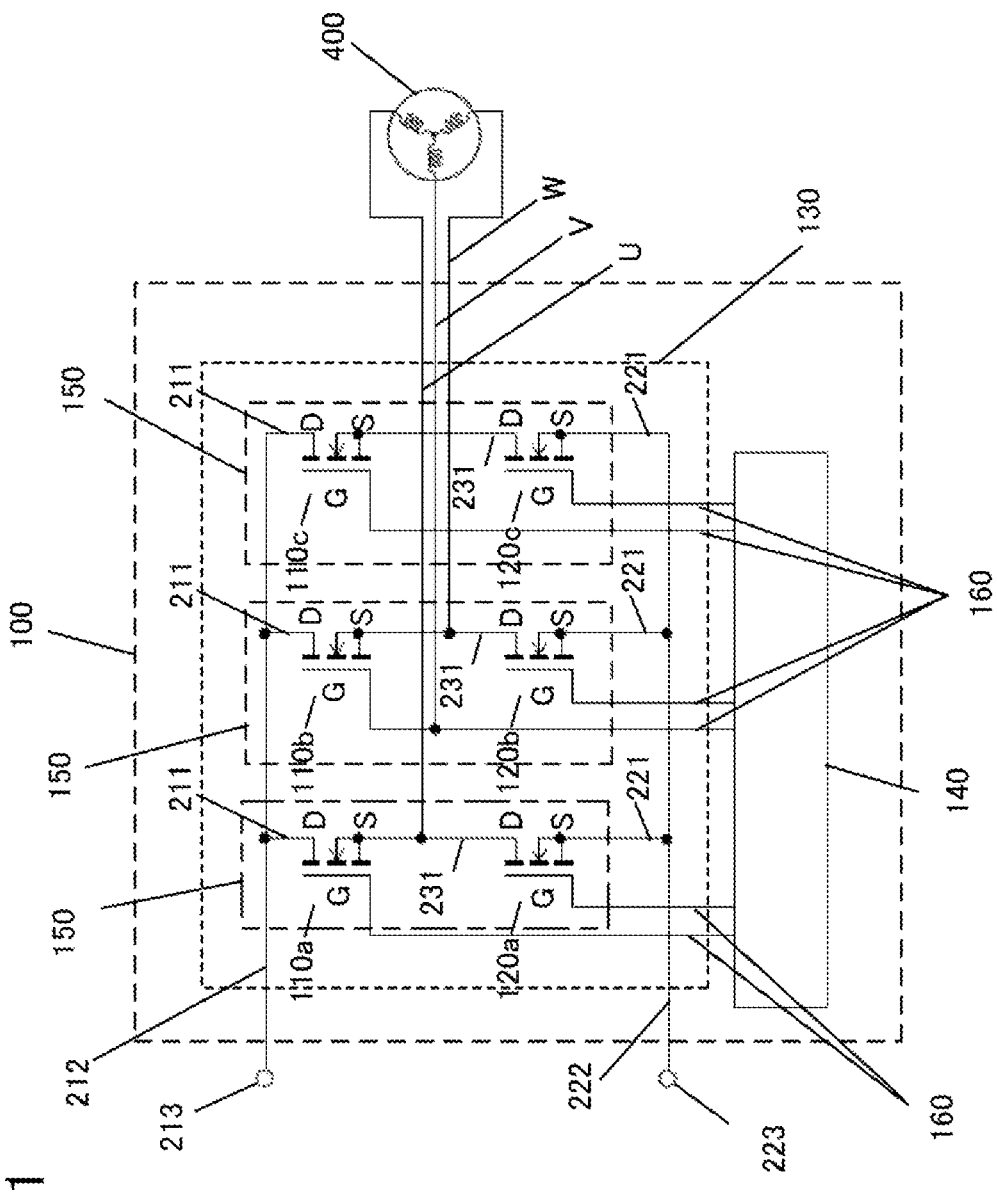
FIG. 1 is a diagram showing an example of a circuit schematic of a semiconductor device according to a first embodiment of the present invention.

A semiconductor device 100 according to a first embodiment of the present invention will be described with reference to FIGS. 1 to 10. FIG. 1 is a diagram showing an example of a circuit schematic of the semiconductor device 100 according to the present embodiment. The semiconductor device 100 includes an inverter circuit 130 and a controller 140.

The inverter circuit 130 includes six metal-oxide-semiconductor field-effect-transistors (MOS FETs) 110a to 110c, 120a to 120c as switching elements. The MOS FETs 110a to 110c operate as upper arm circuits and the MOS FETs 120a to 120c operate as lower arm circuits. The MOS FETs 110a and 120a are connected in series, the MOS FETs 110b and 120b are connected in series, and the MOS FETs 110c and 120c are connected in series, to constitute respective upper and lower arm series circuits 150. The upper and lower arm series circuits 150 output AC power of three phases, that is, a U-phase, a V-phase, and a W-phase, corresponding to phase windings of armature windings of a motor generator 400. Note that the MOS FETs 110a to 110c are sometimes representatively referred to as a MOS FET 110, and the MOS FETs 120a to 120c are sometimes representatively referred to as a MOS FET 120 in the following description.

A drain electrode D of the MOS FET 110 is connected to a DC positive terminal 213 via conductors 211, 212. A source electrode S of the MOS FET 120 is connected to a DC negative terminal 223 via conductors 221, 222. A source electrode S of the MOS FET 110 and a drain electrode D of the MOS FET 120 are connected with each other by a conductor 231. Gate electrodes of the MOS FETs 110 and 120 are connected to the controller 140 by control conductors 160.

The controller 140 includes a driver circuit that controls driving of the upper and lower arm series circuits 150. The controller 140 may include a control circuit that supplies control signals to the driver circuit. The MOS FETs 110 and 120 operate in response to driving signals output from the controller 140 and convert DC power supplied from a battery, not shown, to three-phase AC power.

Figure 2:
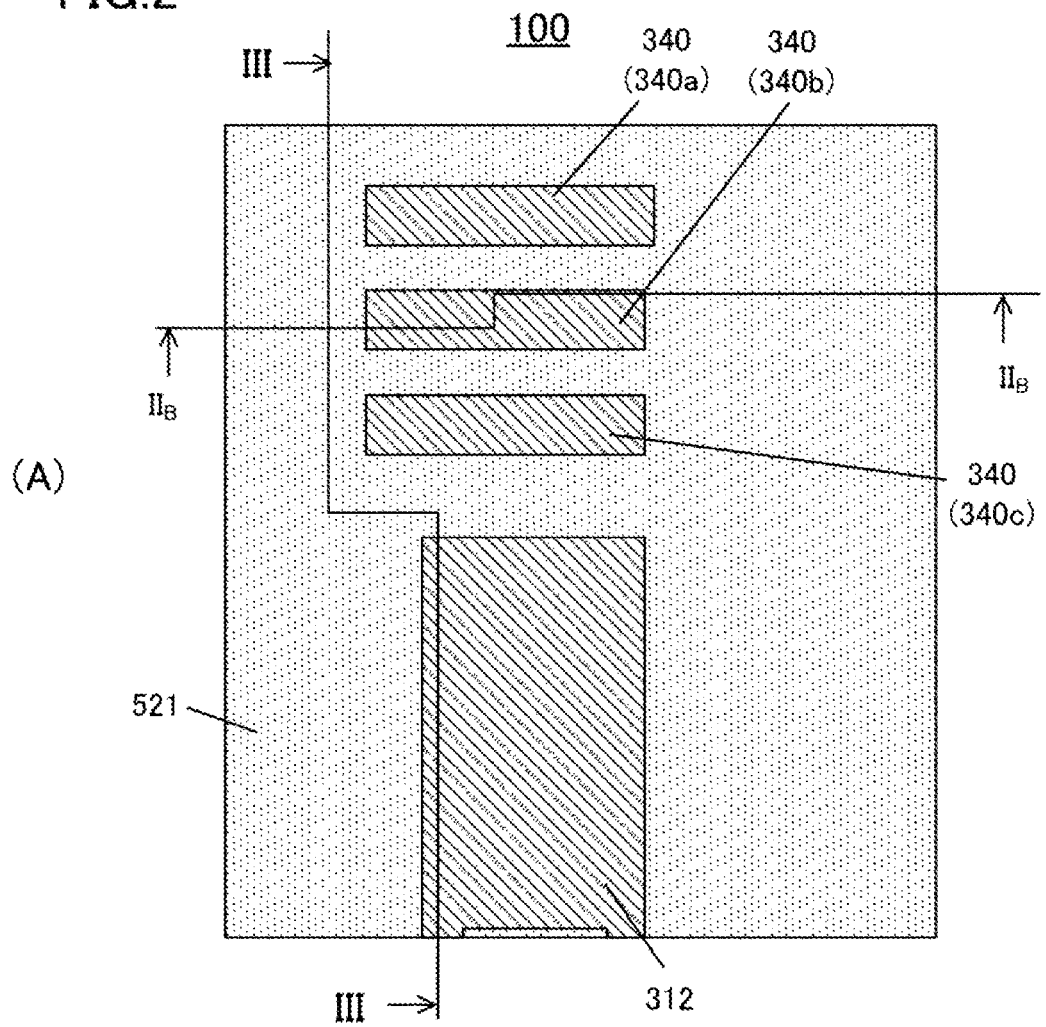
FIG. 2(A) is a top view of the semiconductor device according to the first embodiment.
FIG. 2(B) is a cross-sectional view taken along line IIB-IIB of FIG. 2(A)
Figure 2:
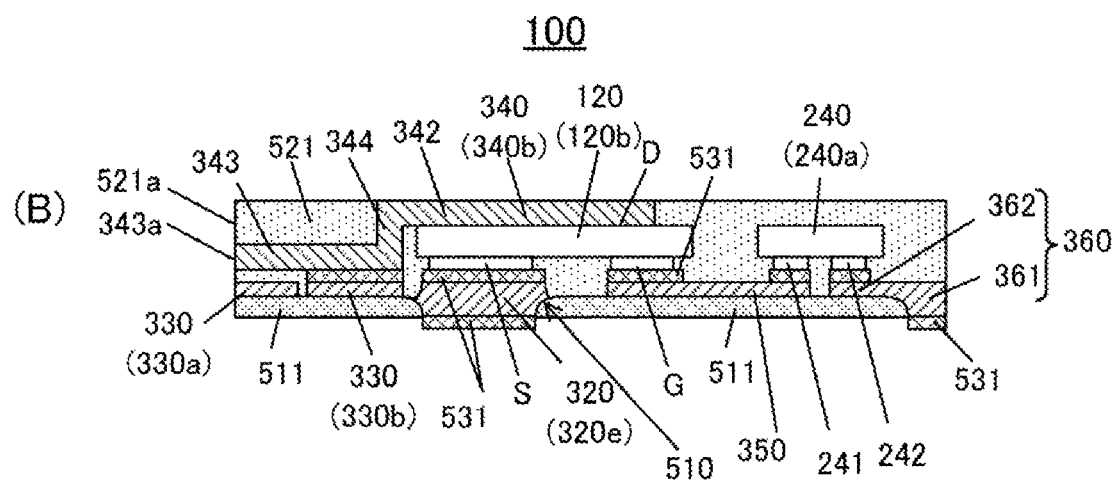
Figure 3:
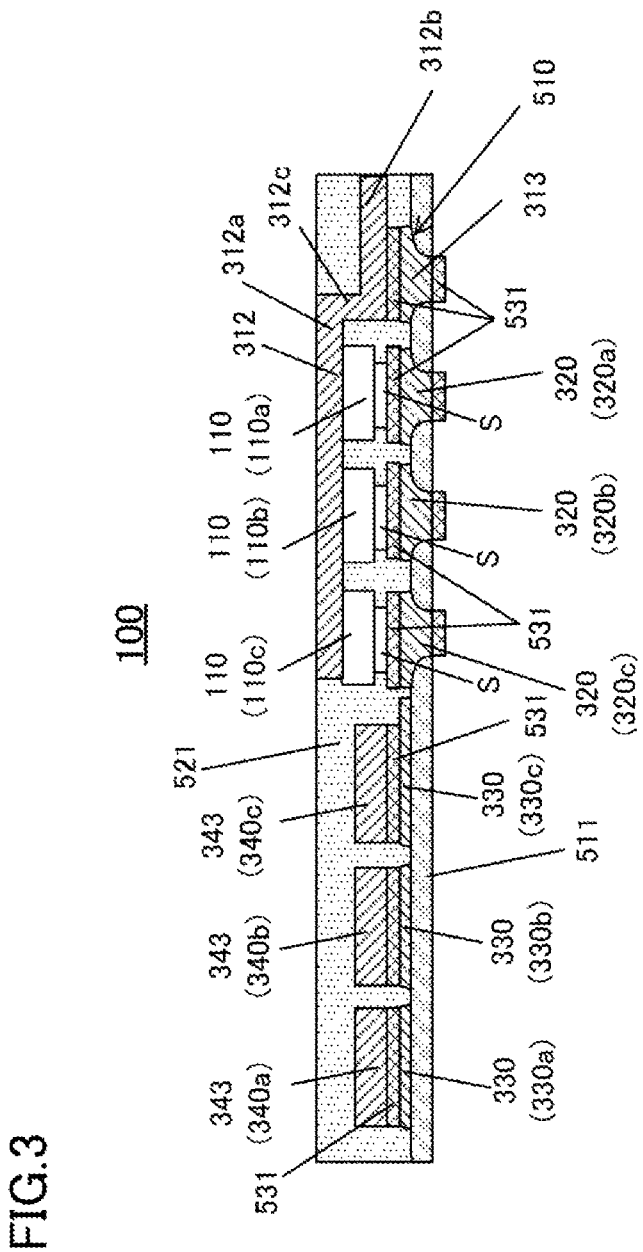
FIG. 3 is a cross-sectional view of the semiconductor device taken along line of FIG. 2(A)
Figure 4:
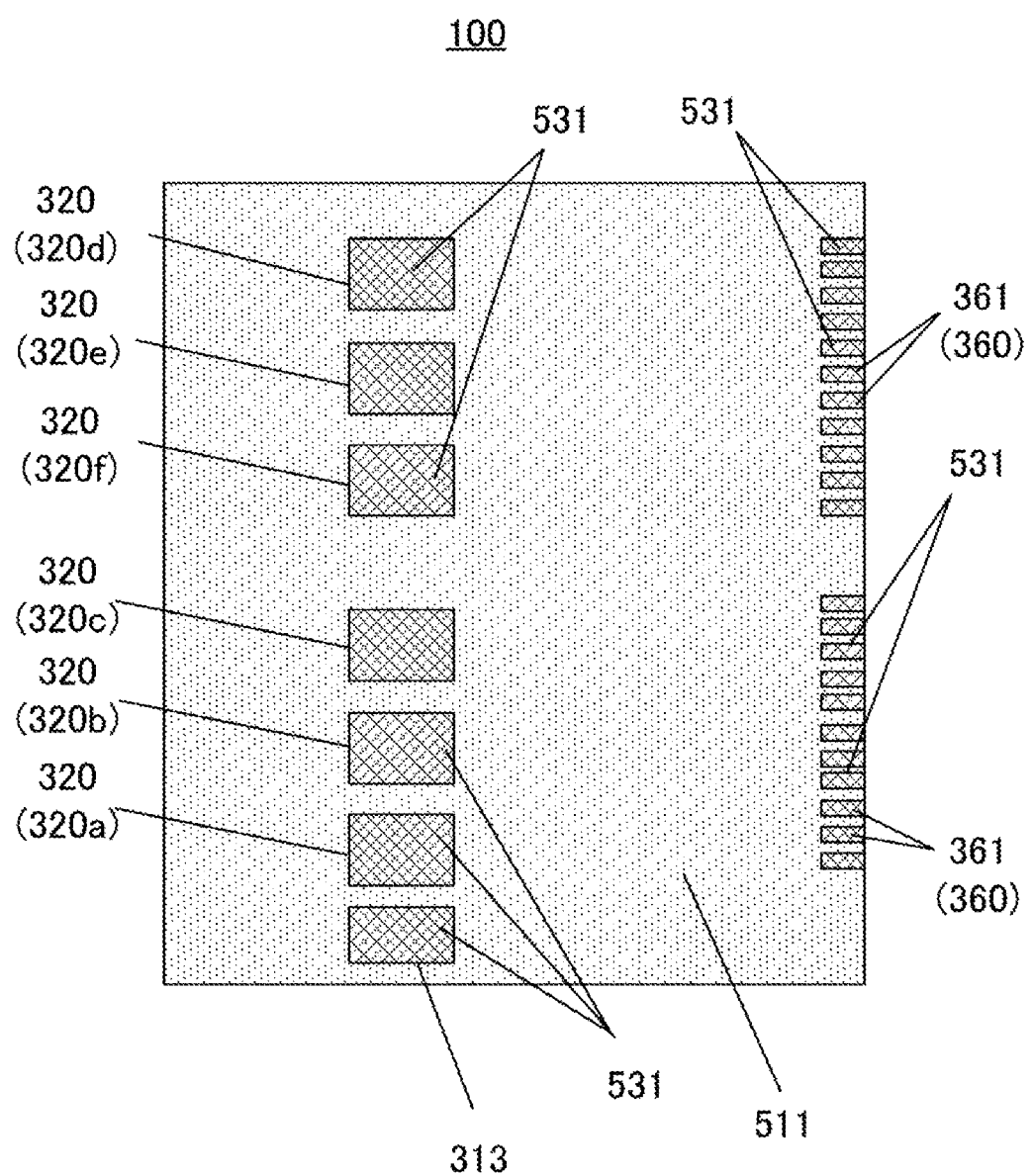
FIG. 4 is a bottom view of the semiconductor device of FIG. 2.

FIG. 2(A) is a top view of the semiconductor device 100 according to the present embodiment, and FIG. 2(B) is a cross-sectional view taken along line IIB-IIB of FIG. 2(A). FIG. 3 is a cross-sectional view of the semiconductor device 100 taken along line of FIG. 2(A). FIG. 4 is a bottom view of the semiconductor device of FIG. 2.

Figure 7:
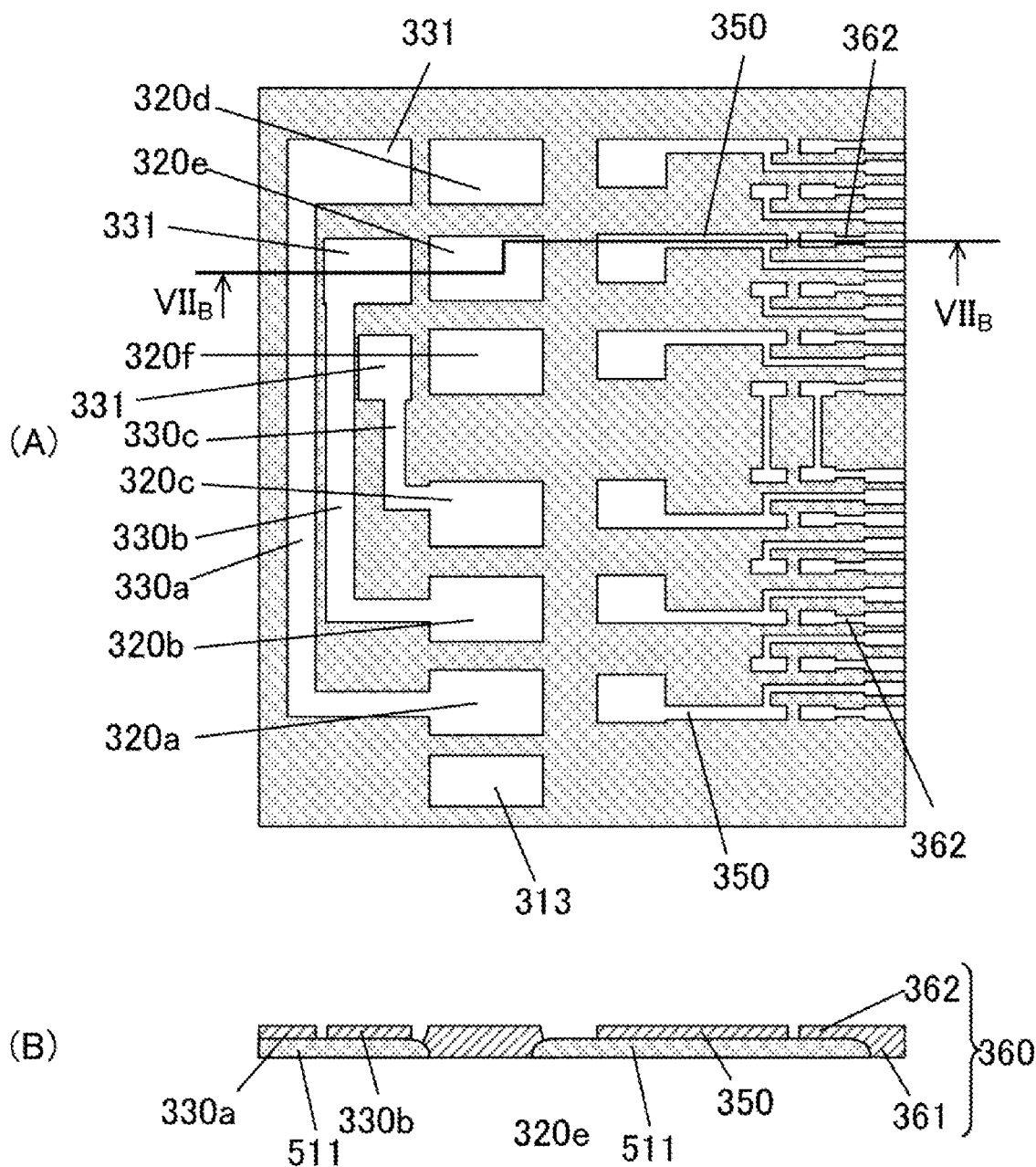
FIG. 7 shows the method for manufacture of the semiconductor device subsequent to FIG. 6, where
Figure 9:
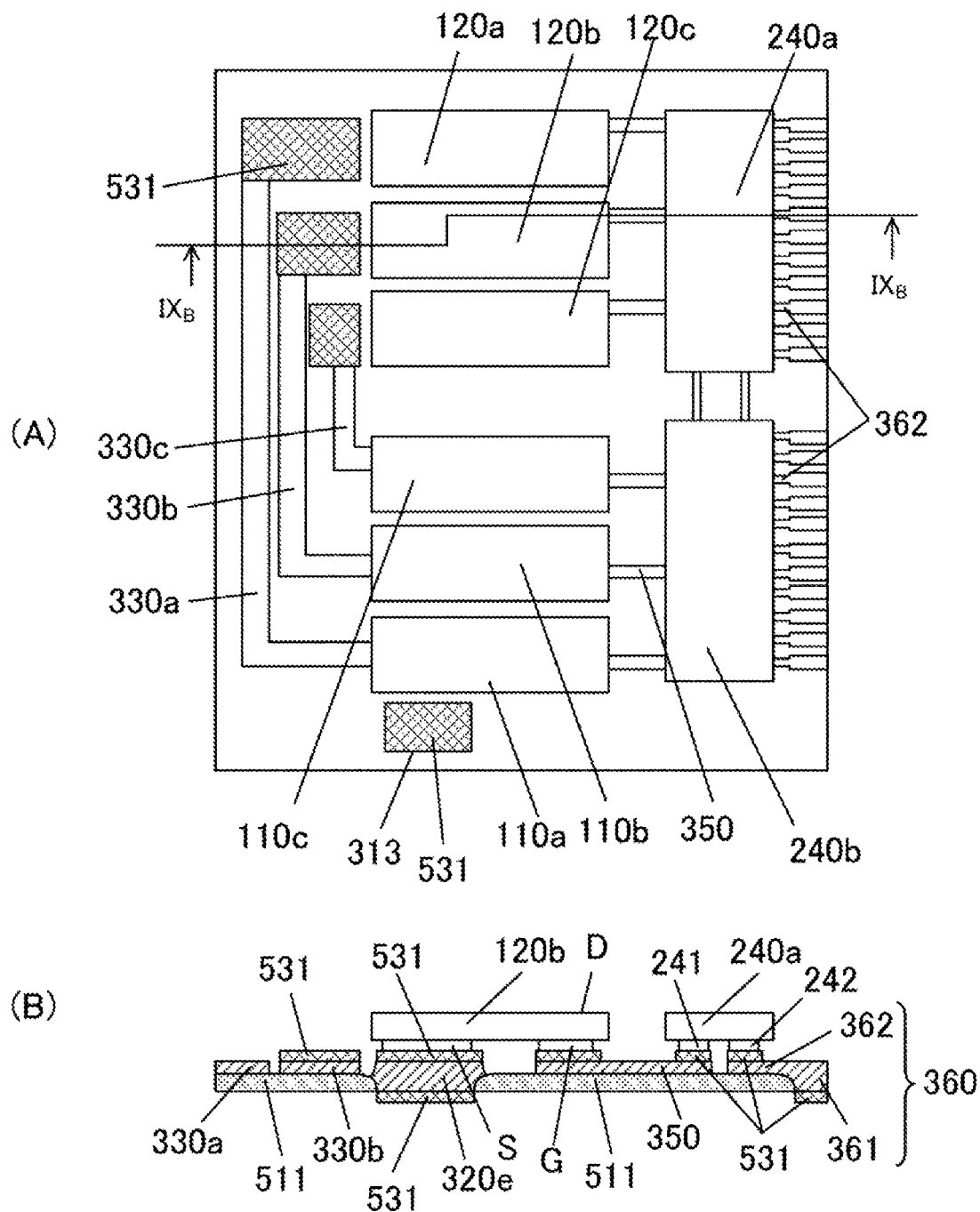
FIG. 9 shows the method for manufacture of the semiconductor device subsequent to FIG. 8, where

The semiconductor device 100 includes the six MOS FETs 110, 120 (see FIGS. 2(B), 3), six source lead terminals 320 (see FIG. 4), a drain connection lead terminal 313 (see FIGS. 3, 4), a plurality of I/O lead terminals 360 (see FIG. 4), a resin 511 (see FIGS. 2(B), 3), two control semiconductor elements 240a, 240b (see FIGS. 2(B), 9), a plurality of connecting conductors 350 (see FIGS. 2(B), 7), three routing conductors 330 (see FIGS. 2(B), 7), a drain connecting conductor 312 (see FIGS. 2(A), 3), three drain conductors 340 (see FIG. 2(A)), and a sealing resin 521 (see FIGS. 2(A), 2(B), 3). The six MOS FETs 110, 120 are packaged into one body by the sealing resin 521, and the semiconductor device 100 according to the present embodiment thus has a six-in-one structure.

The six source lead terminals 320 (see FIG. 4) include source lead terminals 320a to 320f (see FIG. 4). The source lead terminals 320a to 320f, the drain connection lead terminal 313, and the plurality of I/O lead terminals 360 (see FIG. 4) are sealed with the resin 511 and constitute a lead terminal sealing body 510 (see FIGS. 2(B), 3).

Note that the control semiconductor elements 240a, 240b correspond to the controller 140 in FIG. 1 and control driving of the six MOS FETs 110, 120. The MOS FETs 110 and 120 operate in response to driving signals output from the control semiconductor elements 240a, 240b and convert DC power supplied from a battery, not shown, to three-phase AC power. That is, a plurality MOS FETs 110, 120 and the control semiconductor elements 240a, 240b constitute a power converter.

The drain conductors 340 include drain conductors 340a to 340c (see FIGS. 2(A), 2(B)). The routing conductors 330 include routing conductors 330a to 330c (see FIGS. 2(B), 7). The source lead terminals 320a to 320f are sometimes representatively referred to as a source lead terminal 320, the drain conductors 340a to 340c are sometimes representatively referred to as a drain conductor 340, and the routing conductors 330a to 330c are sometimes representatively referred to as a routing conductor 330 in the following description.

Each drain conductor 340 is electrically connected to a routing conductor 330 (see FIGS. 2(B), 7) formed integrally with a source lead terminal 320. That is, the drain conductor 340 and the routing conductor 330 correspond to the conductor 231 shown in FIG. 1. Furthermore, the drain connecting conductor 312 is connected to the drain connection lead terminal 313. That is, the drain connecting conductor 312 and the drain connection lead terminal 313 correspond to the conductors 211 and 212 shown in FIG. 1. The connecting conductor 350 corresponds to the control conductor 160 shown in FIG. 1.

Figure 5:
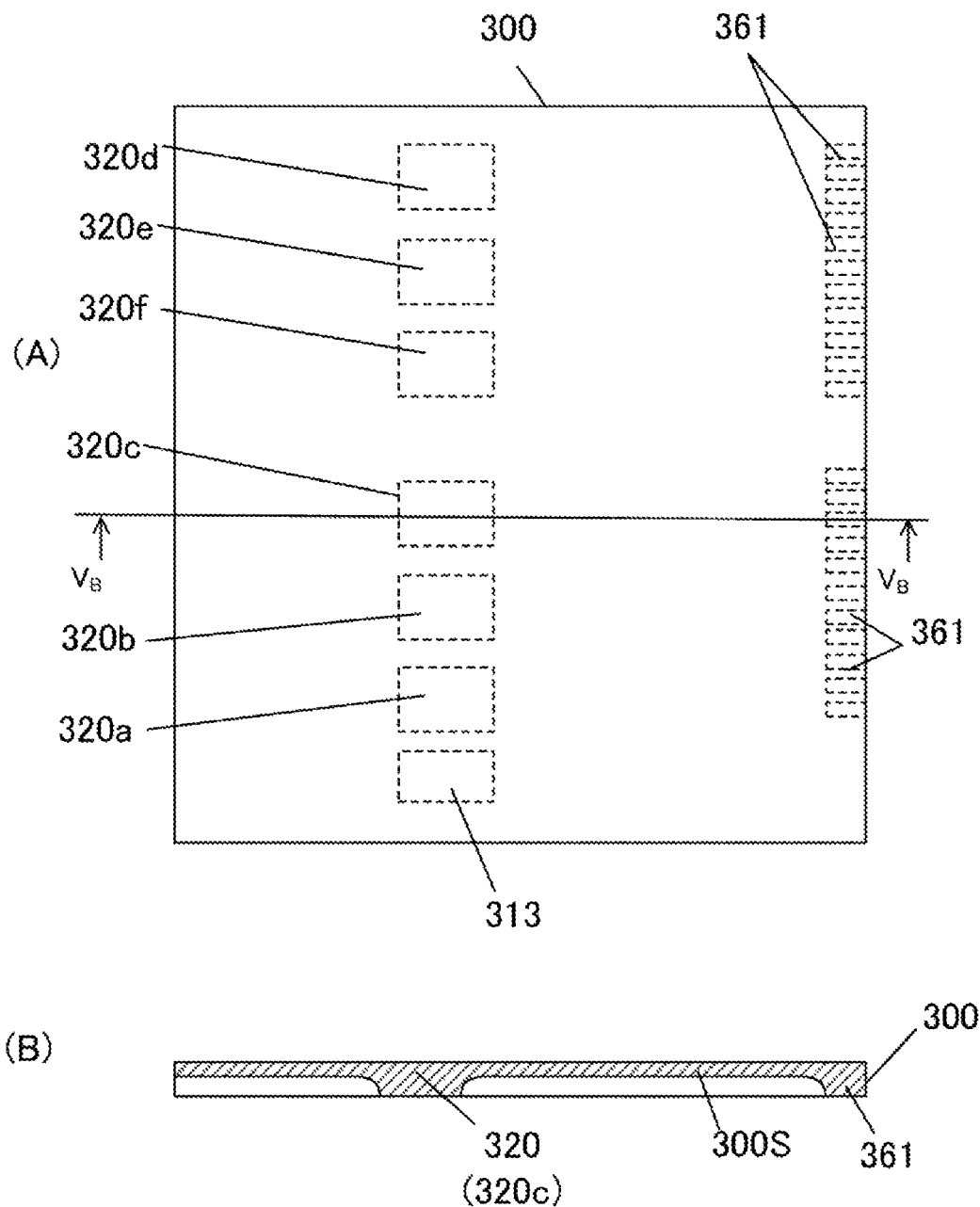
FIG. 5 shows an exemplary method for manufacture of the semiconductor device of FIG. 2, where

The source lead terminals 320, the drain connection lead terminal 313, the plurality of I/O lead terminals 360, the routing conductors 330, and the connecting conductors 350 are formed of a lead frame 300 (see FIG. 5). The routing conductors 330 and the connecting conductors 350 are formed by half-etching the lead frame 300 to be thinner than the source lead terminals 320 and the drain connection lead terminal 313. The I/O lead terminals 360 each have a mounting part 361 provided at a tip side thereof and a connecting part 362 thinner than the mounting part 361 (see FIG. 2(B)). The connecting parts 362 of the I/O lead terminals 360 are formed by half-etching the lead frame 300.

An upper surface of the drain conductor 340 forms same plane with an upper surface of the sealing resin 521 and is exposed from the sealing resin 521. Respective lower surfaces of the source lead terminal 320, the drain connection lead terminal 313, and the mounting part 361 of the I/O lead terminal 360 forms same plane with a lower surface of the resin 511 and are exposed from the resin 511. The source lead terminals 320 and the mounting parts 361 of the I/O lead terminals 360 each have a lower surface including at least a portion exposed from the resin 511, at a side of the resin 511 opposite to a side where the MOS FET 110 and the control semiconductor element 240 are arranged.

The routing conductors 330 and the connecting conductors 350 as well as the source lead terminals 320, the drain connection lead terminal 313, and the plurality of I/O lead terminals 360 are integrated by the resin 511. Therefore, the routing conductors 330 and the connecting conductors 350 are held by the resin 511.

The respective source electrodes S of the MOS FETs 110, 120 are each coupled to a source lead terminal 320 via a coupling layer 531. The respective gate electrodes G of the MOS FETs 110, 120 are each coupled to one end of a connecting conductor 350 via a coupling layer 531. The control semiconductor element 240 has two electrodes 241 and 242, and the electrode 241 as one of them (see FIG. 2(B)) is coupled to another end of the connecting conductor 350 via a coupling layer 531. That is, the connecting conductors 350 held by the resin 511 connect each of the respective gate electrodes G of the MOS FETs 110, 120 with an electrode 241 as one of the two electrodes 241 and 242 of a control semiconductor element 240. The electrode 242 as the other of the two electrodes 241 and 242 of the control semiconductor element 240 (see FIG. 2(B)) is coupled to the connecting part 362 of the I/O lead terminal 360 via a coupling layer 531.

The coupling layers 531 are formed on the respective surfaces exposed from the resin 511 of the source lead terminals 320, the drain connection lead terminal 313, and the mounting parts 361 of the I/O lead terminals 360. The coupling layers 531 formed on the respective surfaces exposed from the resin 511 of the source lead terminals 320, the drain connection lead terminal 313, and the mounting parts 361 of the I/O lead terminals 360 are coupled to connection pads of a circuit substrate, not shown.

The coupling layers 531 are formed using pre-plated lead frame (PPF) technology. That is, before the MOS FETs 110, 120 and the control semiconductor elements 240a, 240b are coupled to the lead frame 300, the coupling layers 531 are formed on the whole surfaces of the lead frame 300 by sputtering, electroless plating, electroplating, or the like. This process can reduce the number of steps compared to a typical manufacturing process in which, after the MOS FETs 110, 120 and the control semiconductor elements 240a, 240b (hereinafter, sometimes representatively referred to as a "control semiconductor element 240") are coupled to the lead frame 300 via the coupling layers 531, the surfaces exposed from the resin 511 of the source lead terminals 320 and the mounting parts 361 of the I/O lead terminals 360 are provide with the coupling layers 531. In a case where the lead frame 300 is made of copper, the coupling layer 531 can have a multi-layer structure including, for example, from a lead frame 300 side in order, Ni/Au, Pd/Au, Ni/Pd/Au, or the like, or a single-layer structure including Au or the like. The coupling layers 531 as coupling plating layers formed of same material are individually provided between the source electrode S of the MOS FET 110, 120 and the source lead terminal 320, between the electrode 242 of the control semiconductor element 240 and the I/O lead terminal 360, on the surface of the source lead terminal 320 at a side opposite to a side where the source electrode S of the MOS FET 110, 120 is arranged (the surface exposed from the resin 511), and on the surface of the I/O lead terminal 360 at a side opposite to a side where the electrode 242 of the control semiconductor element 240 is arranged (the surface exposed from the resin 511).

The drain electrodes D of the MOS FETs 120a to 120c are electrically connected to the drain conductors 340a to 340c, respectively. As shown in FIG. 2(B), the drain conductors 340a to 340c each have a drain connecting part 342, a source connecting part 343, and an intermediate part 344. The source connecting part 343 is lowered by a stepped part formed between the drain connecting part 342 and the source connecting part 343, and the intermediate part 344 connecting the drain connecting part 342 with the source connecting part 343 is provided at this stepped part. The source connecting part 343 is coupled to the routing conductor 330 via the coupling layer 531. Each routing conductor 330 is formed integrally with a source lead terminal 320 to which the source electrode S of the MOS FET 110 is coupled, and the source electrode S of the MOS FET 110 is thus connected to the drain electrode D of the MOS FET 120.

In more detail, the source electrodes S of the MOS FETs 110a to 110c are respectively connected to the drain electrodes D of the MOS FETs 120a to 120c via the routing conductors 330a to 330c (see FIG. 7) formed integrally with the source lead terminals 320a to 320c and the drain conductors 340a to 340c. For example, the drain conductor 340a mutually connects the drain electrode D of the MOS FET 120a as one of a pair of MOS FETs 110a and 120a with the source electrode S of the MOS FET 110a as the other thereof. Each pair of a plurality of pairs of MOS FETs has similar mutual connectivity. The source lead terminals 320a to 320c are individually coupled to the connection pads of the circuit substrate, not shown, via the coupling layers 531. The source lead terminals 320a to 320c respectively output AC power of the U-phase, the V-phase, and the W-phase (see FIG. 1).

Accordingly, the source lead terminal 320 connected with the source electrode S of the MOS FET 120 is connected to a high potential part (not shown). Meanwhile, the mounting part 361 of the I/O lead terminal 360 is connected to a low potential part (not shown). As shown in FIG. 2(B), the gate electrode G of the MOS FET 120 and the electrode 241 of the control semiconductor element 240 are arranged between the source electrode S of the MOS FET 110 coupled to the source lead terminal 320 and the electrode 242 of the control semiconductor element 240 coupled to the mounting part 361 of the I/O lead terminal 360. This structure can increase a creepage distance between the source lead terminal 320 connected to the high potential part and the mounting part 361 of the I/O lead terminal 360 connected to the low potential part to prevent breakdown due to discharge and to suppress noise failure.

As shown in FIG. 2(B), the source connecting parts 343 of the drain conductors 340a to 340c are extended toward a side surface 521a of the sealing resin 521 and each have an end 343a exposed from the side surface 521a of the sealing resin 521. However, the end 343a of the source connecting part 343 may be covered with the sealing resin 521.

As described above, an upper surface of the drain connecting part 342 of each drain conductor 340 is exposed from the upper surface of the sealing resin 521. Therefore, each drain conductor 340 functions as both a conductive body and a heatsink.

As shown in FIG. 3, the drain connecting conductor 312 includes a drain connecting part 312a, a lead terminal connecting part 312b, and an intermediate part 312c. The lead terminal connecting part 312b is lowered by a stepped part formed between the drain connecting part 312a and the lead terminal connecting part 312b, and the intermediate part 312c connecting the drain connecting part 312a with the lead terminal connecting part 312b is provided at this stepped part. The drain connecting part 312a of the drain connecting conductor 312 is electrically connected to the drain electrodes D of the MOS FETs 110a to 110c. The lead terminal connecting part 312b of the drain connecting conductor 312 is coupled to the drain connection lead terminal 313 via the coupling layer 531. The drain connection lead terminal 313 is connected to the DC positive terminal 213 via the conductor 212 (see FIG. 1), not shown in FIG. 2 and the subsequent figures.

As described above, an upper surface of the drain connecting part 312a of the drain connecting conductor 312 is exposed from the upper surface of the sealing resin 521. Therefore, the drain connecting conductor 312 functions as both a conductive body and a heatsink.

Figure 6:
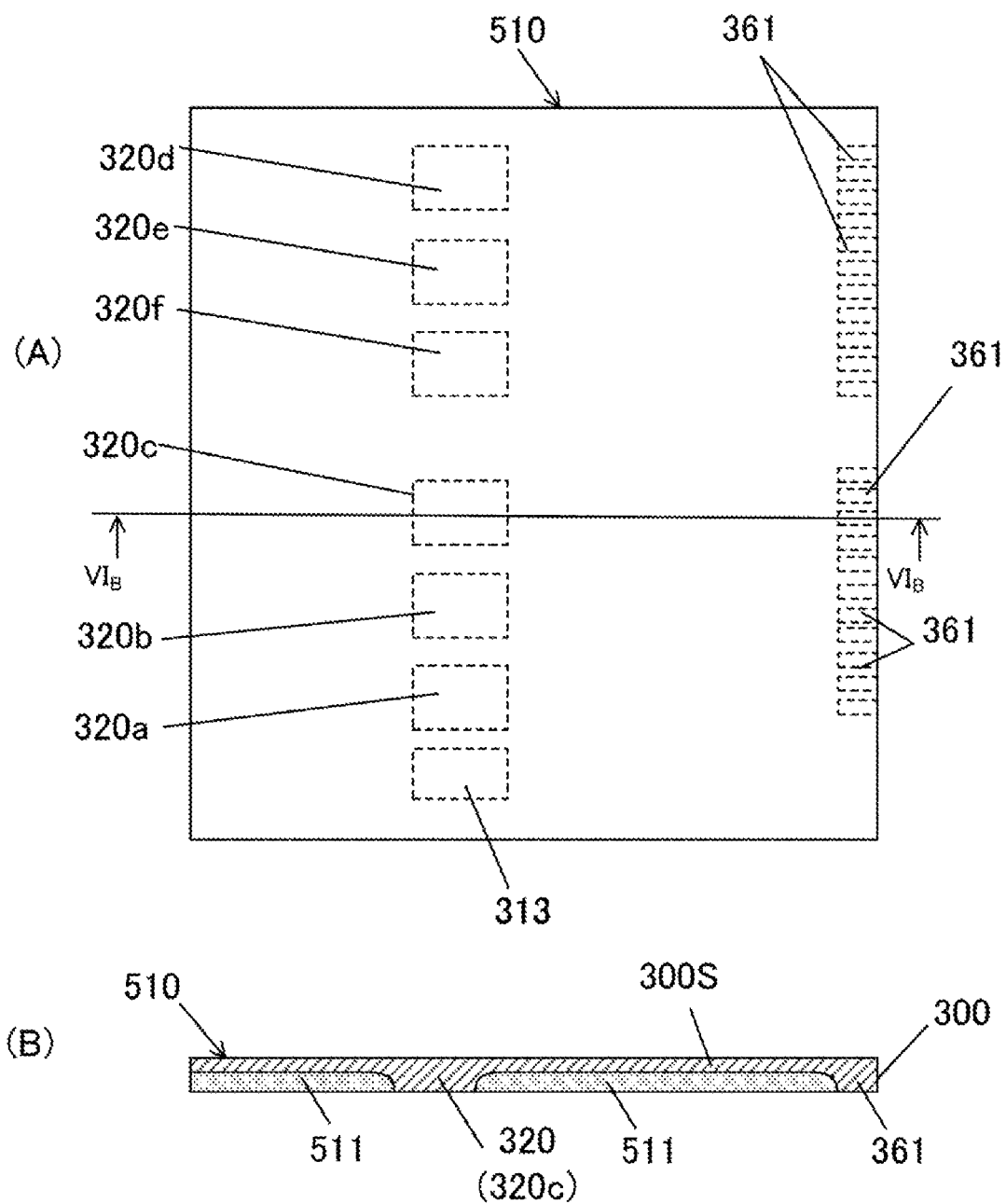
FIG. 6 shows the method for manufacture of the semiconductor device subsequent to FIG. 5, where

A method for manufacture of the semiconductor device will be described with reference to FIGS. 5 to 10. First, a method for manufacture of the lead terminal sealing body 510 will be described with reference to FIGS. 5 to 6. FIG. 5 shows an exemplary method for manufacture of the semiconductor device 100 of FIG. 2, where FIG. 5(A) is a top view and FIG. 5(B) is a cross-sectional view taken along line VB-VB of FIG. 5(A). FIG. 6 shows the method for manufacture of the semiconductor device 100 subsequent to FIG. 5, where FIG. 6(A) is a top view and FIG. 6(B) is a cross-sectional view taken along line VIB-VIB of FIG. 6(A).

The lead frame 300 in a form of a flat plate is provided. The lead frame 300 is made of metal with high conductivity and, for example, copper or copper alloy is a suitable material. The lead frame 300 is used to simultaneously produce many semiconductor devices 100. However, the method for manufacture of one semiconductor device 100 is illustrated below under an assumption that the lead frame 300 has a size corresponding to one semiconductor device 100.

As shown in FIGS. 5(A), 5(B), the lead frame 300 is then half-etched from a lower surface side. Half etching results in formation of a lead frame thinned part 300S in an area other than where the source lead terminals 320a to 320f, the drain connection lead terminal 313, and the mounting parts 361 of the I/O lead terminals 360 are formed.

Next, as shown in FIGS. 6(A), 6(B), the area of the lead frame 300 where the lead frame thinned part 300S is formed is filled with the resin 511 by molding such as compression molding or transfer molding, for example. The area is, in other words, the area of the lead frame 300 other than the source lead terminals 320a to 320f, the drain connection lead terminal 313, and the mounting parts 361 of the I/O lead terminals 360. After the area having the lead frame thinned part 300S is filled with the resin 511, the lead frame 300 and the resin 511 are preferably flattened at a lower surface side by a grinding process. In this way, the source lead terminals 320a to 320f, the drain connection lead terminal 313, and the mounting parts 361 of the I/O lead terminals 360 are integrated by the resin 511 to form the lead terminal sealing body 510.

Next, a step of sealing the MOS FETs 110, 120 and the control semiconductor elements 240 with the sealing resin 521 will be described below with reference to FIGS. 7 to 10. The step of sealing the MOS FETs 110, 120 and the control semiconductor elements 240 with the sealing resin 521 includes a step of forming the lead frame thinned part 300S into the routing conductors 330, the connecting conductors 350, and the I/O lead terminals 360 and a step of coupling the MOS FETs 110, 120 and the control semiconductor elements 240 to the routing conductors 330, the connecting conductors 350, and the I/O lead terminals 360.

Figure 8:
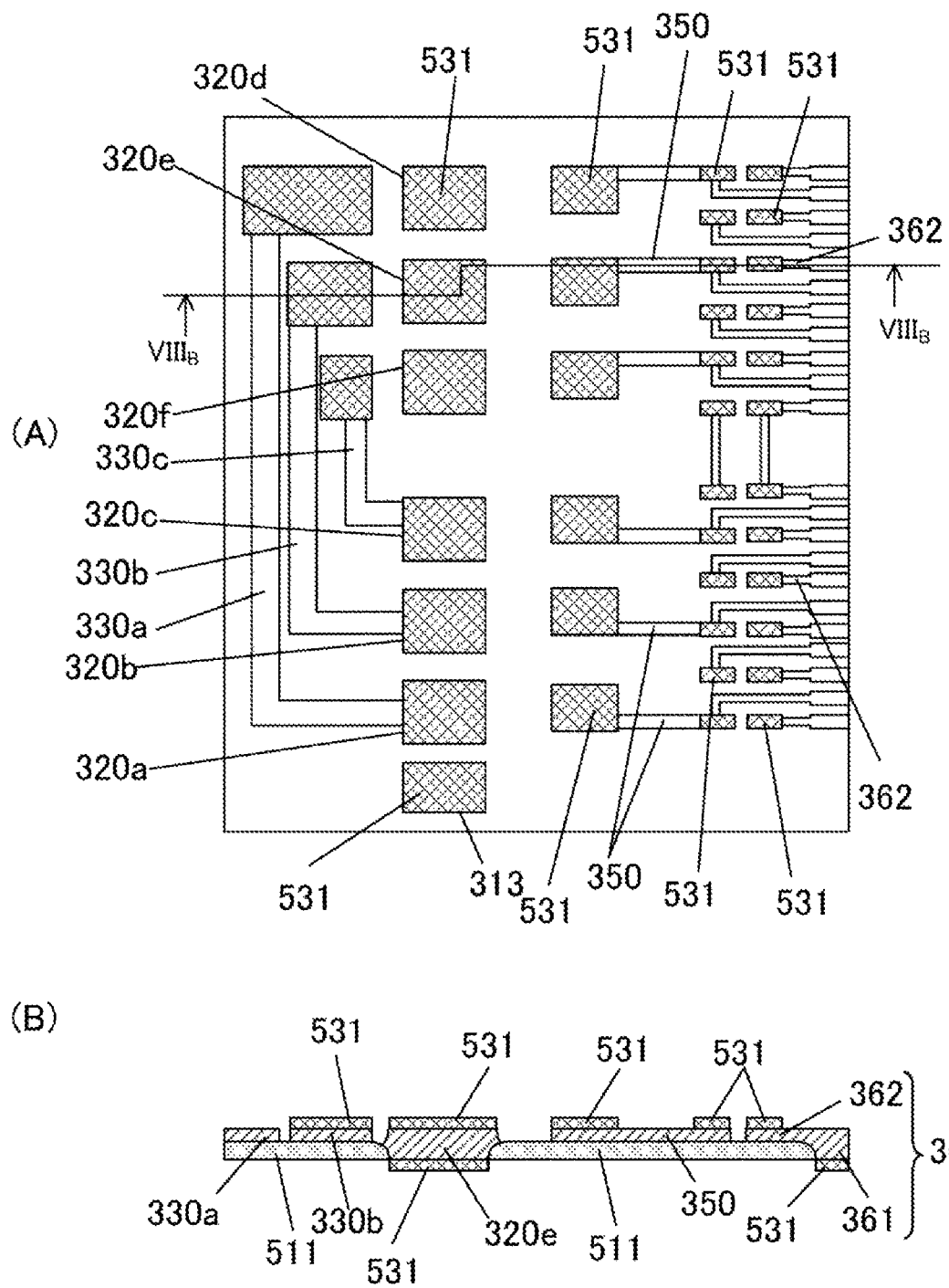
FIG. 8 shows the method for manufacture of the semiconductor device subsequent to FIG. 7, where
Figure 10:
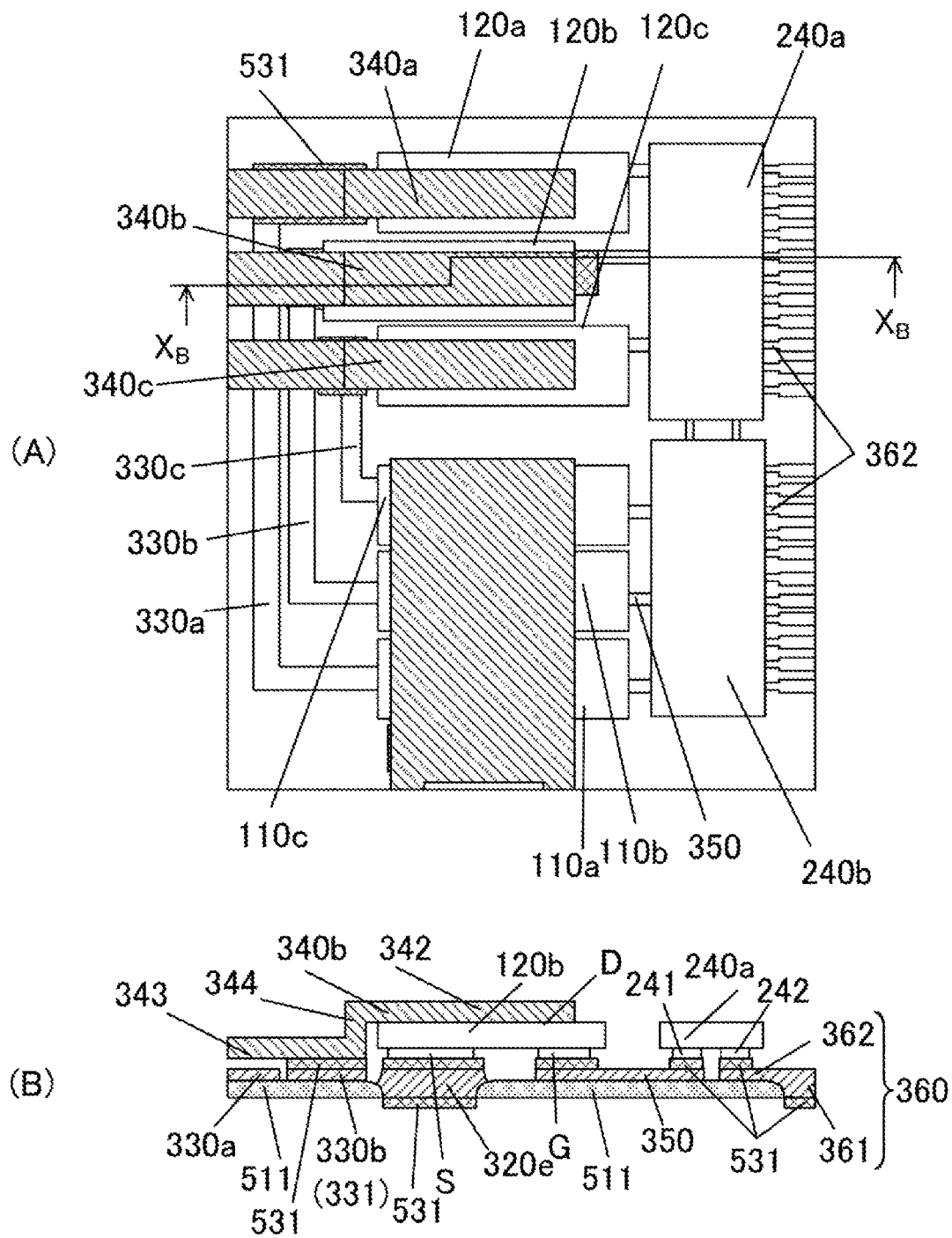
FIG. 10 shows the method for manufacture of the semiconductor device subsequent to FIG. 9, where

FIG. 7 shows the method for manufacture of the semiconductor device 100 subsequent to FIG. 6, where FIG. 7(A) is a top view and FIG. 7(B) is a cross-sectional view taken along line VIIB-VIIB of FIG. 7(A). FIG. 8 shows the method for manufacture of the semiconductor device 100 subsequent to FIG. 7, where FIG. 8(A) is a top view and FIG. 8(B) is a cross-sectional view taken along line VIIIB-VIIIB of FIG. 8(A). FIG. 9 shows the method for manufacture of the semiconductor device 100 subsequent to FIG. 8, where FIG. 9(A) is a top view and FIG. 9(B) is a cross-sectional view taken along line IXB-IXB of FIG. 9(A). FIG. 10 shows the method for manufacture of the semiconductor device 100 subsequent to FIG. 9, where FIG. 10(A) is a top view and FIG. 10(B) is a cross-sectional view taken along line XB-XB of FIG. 10(A).

As shown in FIGS. 7(A), 7(B), the lead frame thinned part 300S is patterned using photolithography technology. As is well known, the photolithography technology is a technique of forming a photoresist film on a surface, applying a mask thereto, and exposing and developing it to form a photoresist pattern. Etching the lead frame thinned part 300S with the photoresist pattern formed on the lead frame thinned part 300S as a mask causes the lead frame thinned part 300S to be formed into a pattern identical to the photoresist pattern.

Patterning the lead frame thinned part 300S results in formation of the source lead terminals 320a to 320f separated from each other. The source lead terminals 320a to 320c are formed integrally with the routing conductors 330a to 330c separated from each other, respectively. Ends 331 of the routing conductors 330a to 330c at a side opposite to the source lead terminals 320a to 320c are formed adjacent to the source lead terminals 320d to 320f, respectively. Furthermore, the drain connection lead terminal 313 is formed separately from the lead frame thinned part 300S by etching the lead frame thinned part 300S.

As shown in FIG. 7(A), the plurality of connecting conductors 350 separated from each other is formed in the lead frame thinned part 300S. Furthermore, the I/O lead terminals 360 each having a mounting part 361 and a connecting part 362 integral with each other are formed in the lead frame thinned part 300S. The connecting part 362 of the I/O lead terminal 360 coupled to the electrode 242 of the control semiconductor element 240 is thinner than the mounting part 361.

In this way, patterning the lead frame thinned part 300S results in mutual separation of the source lead terminals 320a to 320f and the mounting parts 361 of the I/O lead terminals 360, and formation of the routing conductors 330a to 330c, the connecting conductors 350, and the connecting parts 362 of the I/O lead terminals 360. The source lead terminals 320a to 320f and the mounting parts 361 of the I/O lead terminals 360 are sealed with the resin 511, and the routing conductors 330a to 330c, the connecting conductors 350, and the connecting parts 362 of the I/O lead terminals 360 are held by the resin 511.

Next, as shown in FIGS. 8(A), (B), the respective coupling layers 531 are formed on the upper and lower surfaces of the source lead terminals 320a to 320f and the drain connection lead terminal 313, on the lower surfaces of the mounting parts 361 of the I/O lead terminals 360, at one end and another end of each connecting conductor 350, and at one end of each connecting part 362 of the I/O lead terminals 360. The coupling layers 531 are formed by sputtering or plating, for example. The coupling layer 531 may have the single-layer or multi-layer structure.

Next, as shown in FIGS. 9(A), 9(B), the MOS FETs 110, 120 and the control semiconductor elements 240 are coupled to the coupling layers 531 with coupling material such as solder (not shown). In more detail, the source electrodes S of the MOS FETs 110a to 110c are coupled to the coupling layers 531 formed on the source lead terminals 320a to 320c, respectively. The source electrodes S of the MOS FETs 120a to 120c are coupled to the coupling layers 531 formed on the source lead terminals 320d to 320f, respectively. The respective gate electrodes G of the MOS FETs 110a to 110c, 120a to 120c are coupled to the coupling layers 531 each formed on one end of a connecting conductor 350 with the coupling material (not shown).

The control semiconductor elements 240a, 240b each have the two electrodes 241 and 242. The electrode 241 as one of these two electrodes 241 and 242 is coupled to the coupling layer 531 formed on an end of the connecting conductor 350 with the coupling material (not shown), and the electrode 242 as the other thereof is coupled to the coupling layer 531 formed on the connecting part 362 of the I/O lead terminal 360 with the coupling material (not shown).

Next, as shown in FIGS. 10(A), 10(B), the source connecting parts 343 of the drain conductors 340a to 340c are coupled to the coupling layers 531 formed on the ends 331 of the routing conductors 330a to 330c, respectively. The source connecting parts 343 of the drain conductors 340a to 340c are coupled to the ends 331 of the routing conductors 330a to 330c such that the drain connecting parts 342 of the drain conductors 340a to 340c are electrically connected to the drain electrodes D of the MOS FETs 120a to 120c, respectively. The source connecting parts 343 of the drain conductors 340a to 340c may be adhered to the drain electrodes D of the MOS FETs 120a to 120c with a conductive adhesive sheet or conductive adhesive material or may be coupled thereto with coupling material such as solder as appropriate. In this way, the drain electrodes D of the MOS FETs 120a to 120c are connected to the source electrodes S of the MOS FETs 110a to 110c, respectively.

The lead terminal connecting part 312b of the drain connecting conductor 312 is coupled to the coupling layer 531 formed on the drain connection lead terminal 313. The lead terminal connecting part 312b of the drain connecting conductor 312 is coupled to the drain connection lead terminal 313 such that the drain connecting part 312a of the drain connecting conductor 312 is electrically connected to the drain electrodes D of the MOS FETs 110a to 110c. The drain connecting part 312a of the drain connecting conductor 312 may be adhered to the drain electrodes D of the MOS FETs 110a to 110c with a conductive adhesive sheet or conductive adhesive material or may be coupled thereto with coupling material such as solder as appropriate. In this way, the drain electrodes D of the MOS FETs 110a to 110c are electrically connected to each other.

Then, an upper surface of the lead terminal sealing body 510, and the MOS FETs 110, the MOS FETs 120, the control semiconductor elements 240, the drain conductors 340, and the drain connecting conductor 312 provided on the upper surface of the lead terminal sealing body 510 are sealed with the sealing resin 521. Sealing with the sealing resin may be performed by molding such as transfer molding, for example. In this way, there can be provided the semiconductor device 100 of FIGS. 2(A), (B), and 3.

According to the semiconductor device 100 of the first embodiment, following advantageous effects can be achieved.

(1) The semiconductor device 100 includes the at least one MOS FET 110 having the source electrode S, the control semiconductor element 240 having the electrode 242, the source lead terminal 320 connected to the source electrode S of the MOS FET 110, the mounting part 361 of the I/O lead terminal 360 connected to the electrode 242 of the control semiconductor element 240, the resin 511 with which the source lead terminal 320 and the mounting part 361 of the I/O lead terminal 360 are sealed, and the sealing resin 521 with which the MOS FET 110 and the control semiconductor element 240 are sealed. The method for manufacture of this semiconductor device 100 includes sealing the source lead terminal 320 and the I/O lead terminal 360 with the resin 511 to form the lead terminal sealing body 510, connecting the source electrode S of the MOS FET 110 with the source lead terminal 320 of the lead terminal sealing body 510, connecting the electrode 242 of the control semiconductor element 240 with the I/O lead terminal 360 of the lead terminal sealing body 510, and sealing the MOS FET 110, the control semiconductor element 240, and the surface of the lead terminal sealing body 510 at a MOS FET 110 and control semiconductor element 240 side with the sealing resin 521. The source lead terminal 320 and the mounting part 361 of the I/O lead terminal 360 are sealed and held by the resin 511. This structure allows for easy coupling between the source lead terminal 320 and the MOS FET 110 and between the mounting part 361 of the I/O lead terminal 360 and the control semiconductor element 240. Furthermore, there is no risk of damaging a connecting member connecting the semiconductor elements. The step of sealing the MOS FET 110 and the control semiconductor element 240 with the sealing resin 521 is also easy. Therefore, the productivity of the semiconductor device 100 can be enhanced.

(2) The semiconductor device 100 further includes the connecting conductor 350 held by the resin 511. The MOS FET 110 has the gate electrode G, the control semiconductor element 240 has the electrode 241, and the gate electrode G of the MOS FET 110 and the electrode 241 of the control semiconductor element 240 are each connected to the connecting conductor 350. In this way, the connecting conductor 350 equivalent to a wire of a typical circuit substrate can connect the MOS FET 110 with the control semiconductor element 240.

The semiconductor device described in Patent Literature 1 has a structure in which the bonding wire connects the MOS FET and the driver IC with each other, not a structure in which only the lead frame electrically connects them with each other. This structure limits a range of applicable semiconductor devices. Meanwhile, in the semiconductor device 100 of the present invention, the connecting conductor 350 formed of the lead frame electrically connects the MOS FET 110 and the control semiconductor element 240 with each other. This structure greatly expands the range of applicable semiconductor devices. Additionally, the semiconductor device 100 internally has the connecting conductor 350 connecting the semiconductor elements with each other. Therefore, it is possible to increase mounting density of the semiconductor device 100 including the circuit substrate and to achieve downsizing of the semiconductor device 100.

(3) The source lead terminal 320, the mounting part 361 of the I/O lead terminal 360, and the connecting conductor 350 are formed of the lead frame 300, and the connecting conductor 350 is thinner than the source lead terminal 320. Since the connecting conductor 350 is thinner than the source lead terminal 320, etching depth can be smaller. Therefore, it is possible to improve etching accuracy, to make the connecting conductor 350 finer, and to achieve downsizing of the semiconductor device 100. The structure thus balances a trade-off between increasing the thickness of the source lead terminal 320 and the mounting part 361 of the I/O lead terminal 360 for securing heat capacity, and decreasing the thickness of the connecting conductor 350 for higher fineness.

(4) The source lead terminal 320 is connected to the high potential part, and the mounting part 361 of the I/O lead terminal 360 is connected to the low potential part. The gate electrode G of the MOS FET 110 and the electrode 241 of the control semiconductor element 240 are arranged between the source electrode S of the MOS FET 110 coupled to the source lead terminal 320 and the electrode 242 of the control semiconductor element 240 coupled to the mounting part 361 of the I/O lead terminal 360. This structure can increase a creepage distance between the source lead terminal 320 connected to the high potential part and the mounting part 361 of the I/O lead terminal 360 connected to the low potential to prevent breakdown due to discharge and to suppress noise failure.

(5) The source lead terminal 320, the mounting part 361 of the I/O lead terminal 360, and the connecting conductor 350 include copper or copper alloy. This structure can reduce resistance of the circuit conductors in the semiconductor device 100.

(6) The MOS FET 120 has the drain electrode D at a side opposite to a side where the source electrode S and the gate electrode G are arranged, and the semiconductor device 100 further includes the drain conductor 340 connected to the drain electrode D. This structure can reduce height, inductance, capacitance, and resistance of the semiconductor device 100 compared to a structure where a bonding wire is connected to the drain electrode D of the MOS FET 120.

(7) The drain conductor 340 has the upper surface exposed from the sealing resin 521 at a side opposite to a side where the MOS FET 120 is arranged. Therefore, the drain conductor 340 can work not only as a conductive body but also as a heatsink.

(8) The method for manufacture of the semiconductor device 100 of the present embodiment includes forming the coupling layers 531 together on the upper and lower surfaces of the source lead terminal 320 and on the upper and lower surfaces of the I/O lead terminal 360 before coupling the source electrode S of the MOS FET 110 to the source lead terminal 320 of the lead terminal sealing body 510 and before coupling the electrode 242 of the control semiconductor element 240 to the mounting part 361 of the I/O lead terminal 360 of the lead terminal sealing body 510. The upper surface of the upper and lower surfaces of the source lead terminal 320 is a surface to which the source electrode S of the MOS FET 110 is coupled, at a side opposite to the lower surface of the upper and lower surfaces of the source lead terminal 320. The upper surface of the upper and lower surfaces of the I/O lead terminal 360 is a surface to which the electrode 242 of the control semiconductor element 240 is coupled, at a side opposite to the lower surface of the upper and lower surfaces of the I/O lead terminal 360. This process can reduce the number of steps compared to the typical manufacturing process in which, after the MOS FET 110 and the control semiconductor element 240 are coupled to the lead frame 300 via the coupling layers 531, the surfaces exposed from the resin 511 of the source lead terminal 320 and the mounting part 361 of the I/O lead terminal 360 are provided with the coupling layers 531.

Second Embodiment

Figure 11:
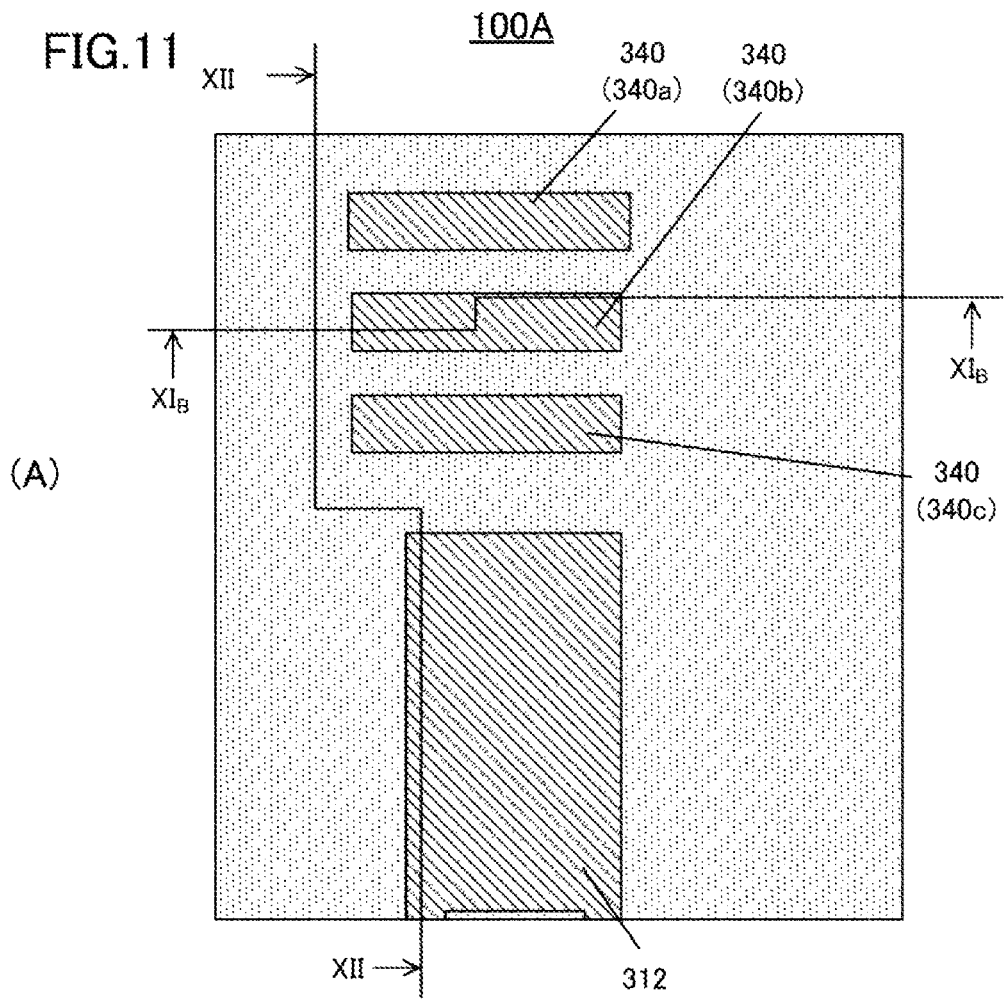
FIG. 11 shows a semiconductor device according to a second embodiment of the present invention, where
Figure 11:
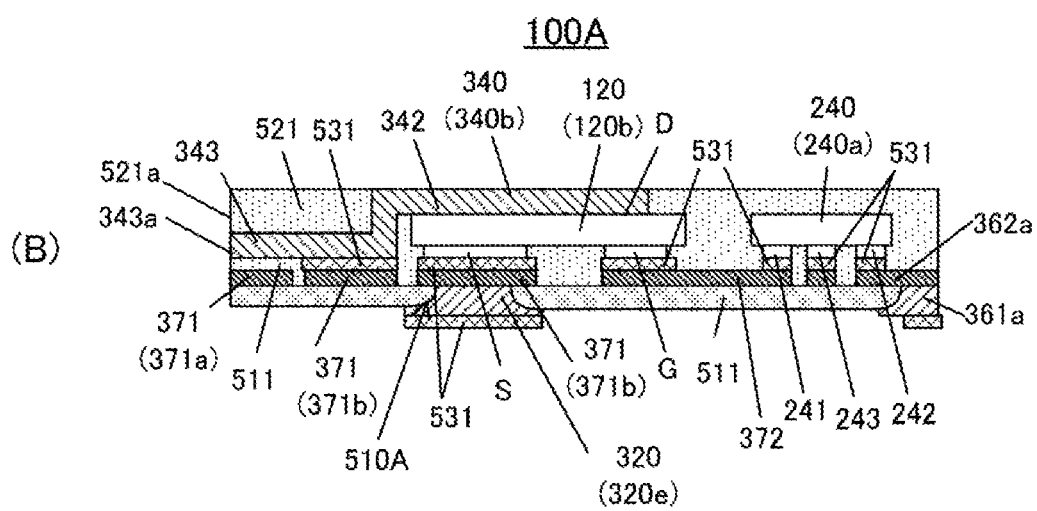
Figure 12:
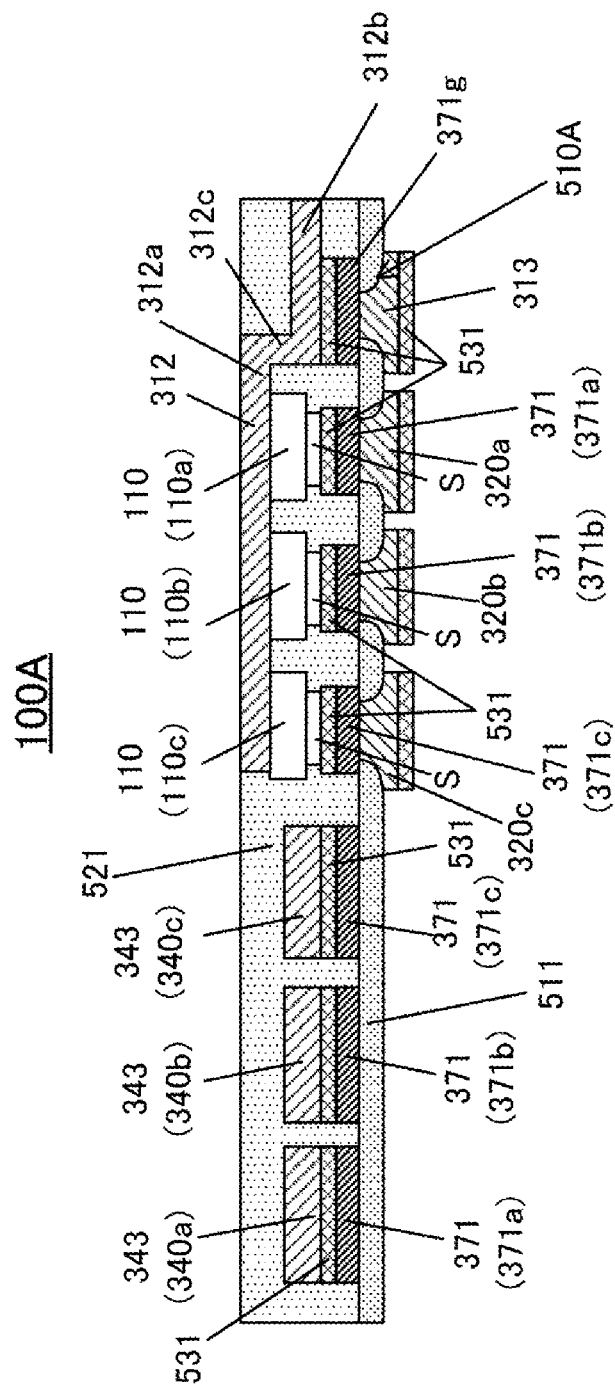
FIG. 12 is a cross-sectional view of the semiconductor device taken along line XII-XII of FIG. 11(A)
Figure 13:
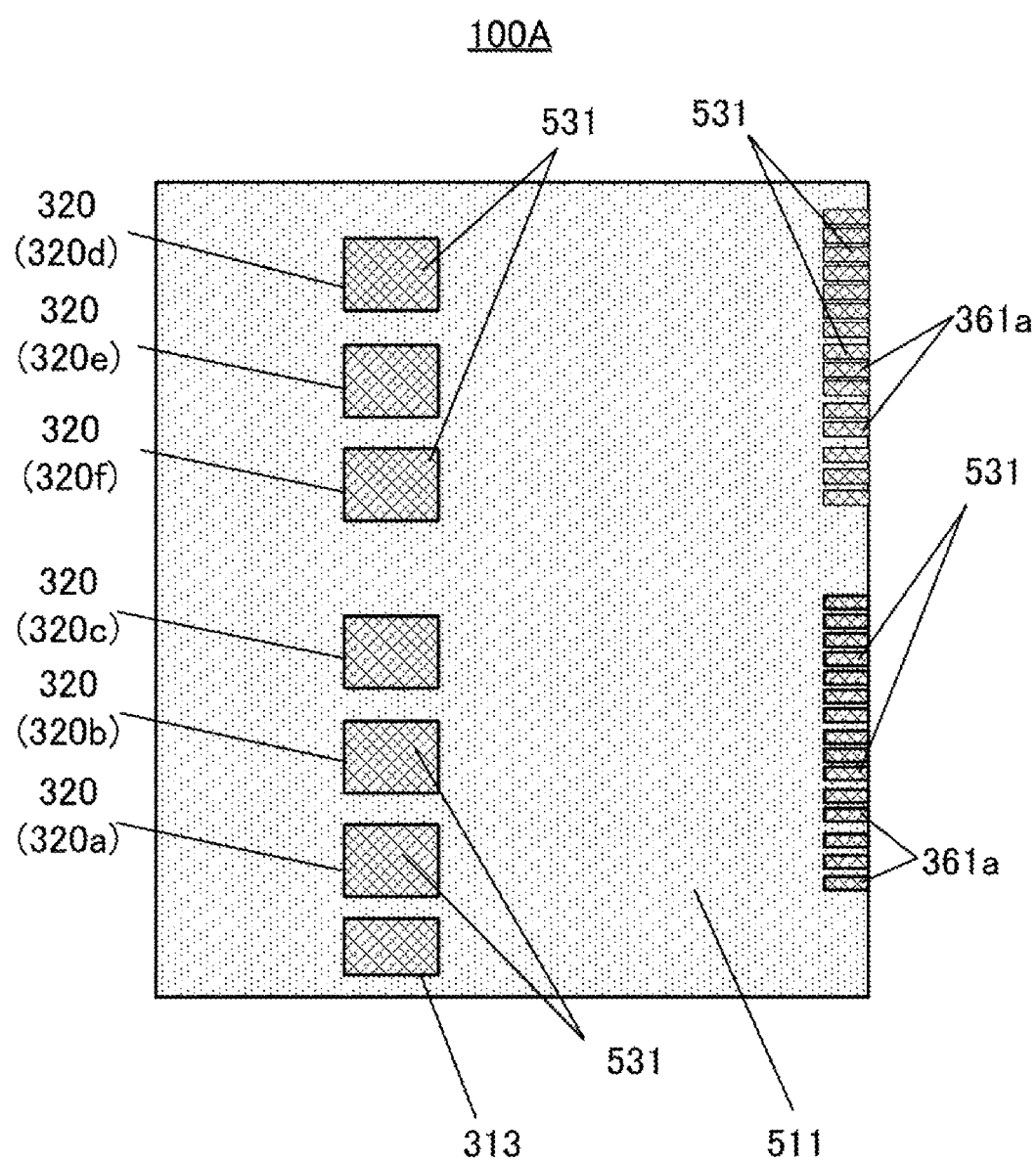
FIG. 13 is a bottom view of the semiconductor device of FIG. 11.

A semiconductor device 100A according to a second embodiment of the present invention will be described with reference to FIGS. 11 to 20. FIG. 11 shows the semiconductor device 100A according to the present embodiment, where FIG. 11(A) is a top view and FIG. 11(B) is a cross-sectional view taken along line XIB-XIB of FIG. 11(A). FIG. 12 is a cross-sectional view of the semiconductor device 100A taken along line XII-XII of FIG. 11(A). FIG. 13 is a bottom view of the semiconductor device 100A of FIG. 11.

In the semiconductor device 100A according to the second embodiment, circuit conductors are not formed of the lead frame 300 but are formed by plating, the circuit conductors corresponding to the routing conductors 330a to 330c, the connecting conductors 350, the connecting parts 362 of the I/O lead terminals 360, and the like in the semiconductor device 100 according to the first embodiment.

In the description below, configurations different from those in the first embodiment are mainly described. Configurations similar to those in the first embodiment are denoted with the same reference signs as the corresponding configurations, and explanations thereof are appropriately omitted. The second embodiment is illustrated under an assumption that the control semiconductor element 240 includes a third electrode 243 in addition to the electrode 241 and the electrode 242. As in the first embodiment, the control semiconductor element 240 in the second embodiment may include just the two electrodes, that is, the electrode 241 and the electrode 242.

Figure 17:
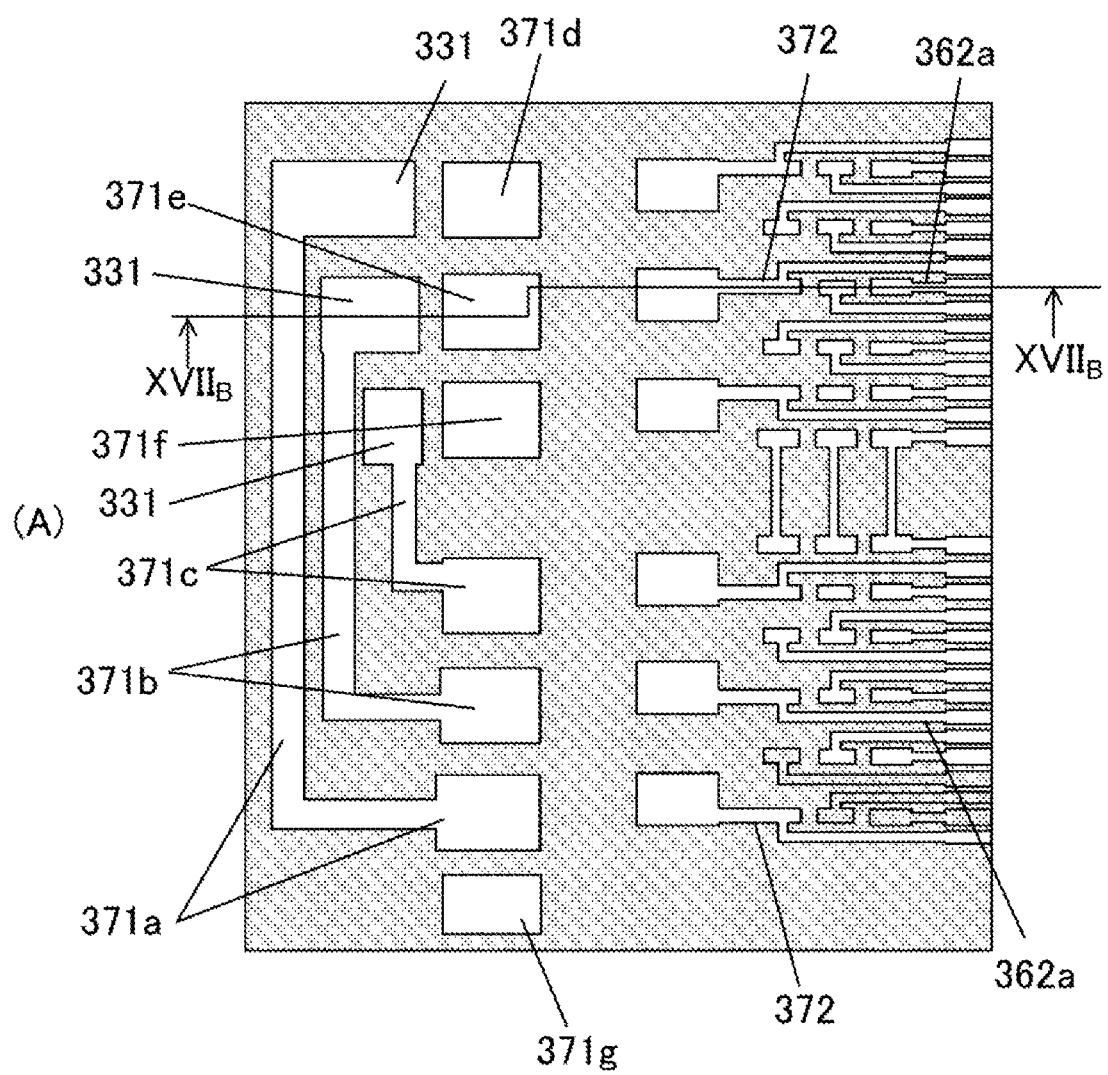
FIG. 17 shows the method for manufacture of the semiconductor device subsequent to FIG. 16, where
Figure 17:
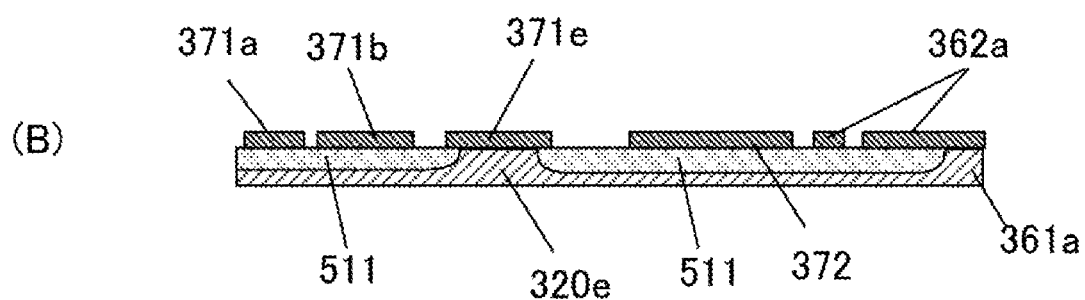
Figure 19:
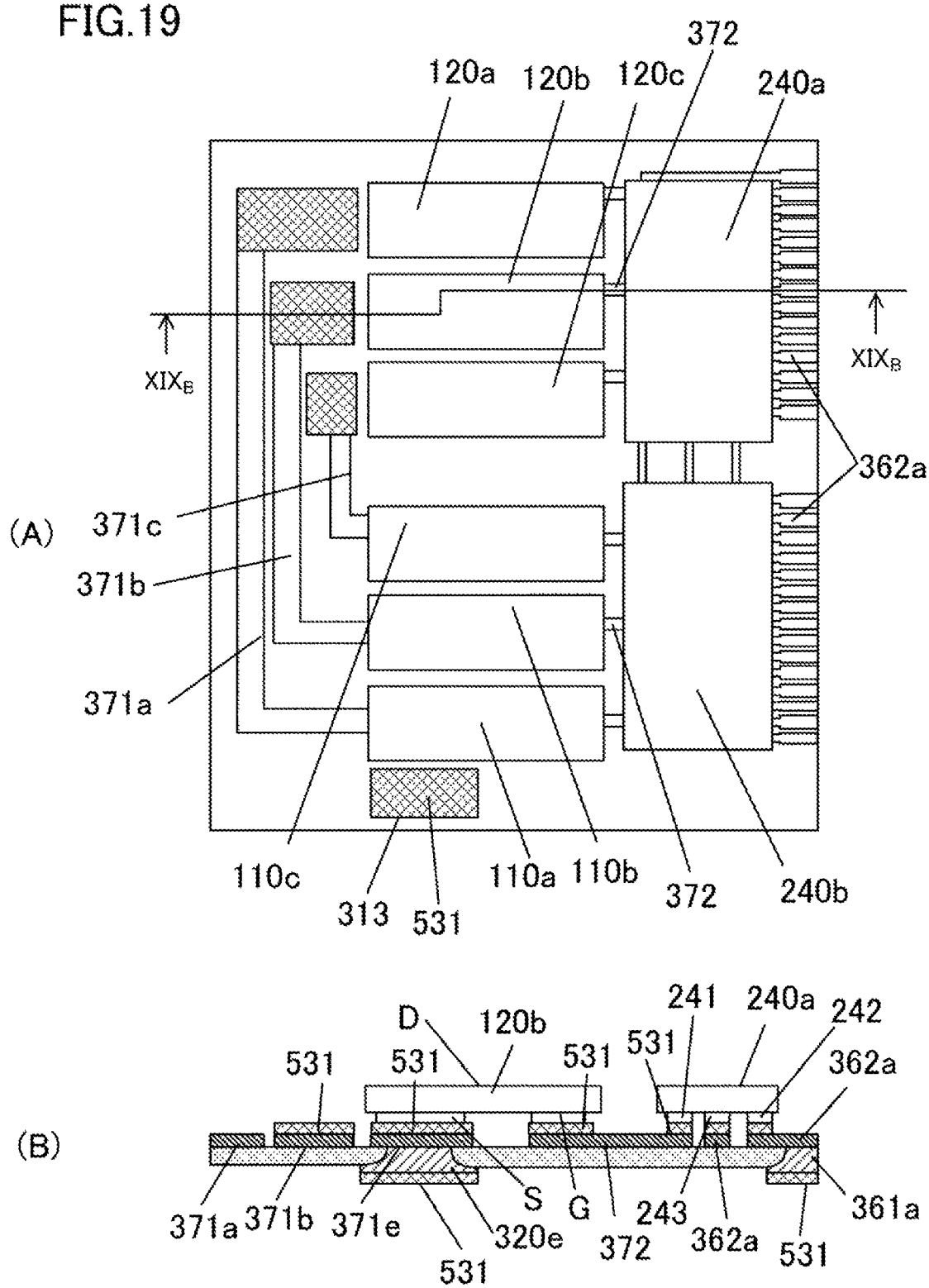
FIG. 19 shows the method for manufacture of the semiconductor device subsequent to FIG. 18, where

The semiconductor device 100A includes the six MOS FETs 110, 120 (see FIGS. 11(B), 12), the six source lead terminals 320 (see FIG. 13), the drain connection lead terminal 313 (see FIGS. 12, 13), a plurality of I/O lead terminal mounting parts 361a (see FIG. 13), I/O lead terminal connecting parts 362a, the resin 511 (see FIGS. 11(B), 13), the two control semiconductor elements 240a, 240b (see FIGS. 11(B), 19), a plurality of connecting conductors 372 (see FIGS. 11(B), 17), seven conductors 371 (see FIGS. 11(B), 17), the drain connecting conductor 312 (see FIGS. 11(A), 11(B)), the three drain conductors 340 (see FIGS. 11(A), 11(B)), and the sealing resin 521 (see FIGS. 11(A), 11(B), 12).

The six source lead terminals 320 (see FIG. 14) include the source lead terminals 320a to 320f (see FIG. 13). The source lead terminals 320a to 320f, the drain connection lead terminal 313, and the plurality of I/O lead terminal mounting parts 361a (see FIG. 11) are sealed with the resin 511 and constitute a lead terminal sealing body 510A.

The three drain conductors 340 include the drain conductors 340a to 340c (see FIGS. 11(A), 11(B)). The seven conductors 371 include conductors 371a to 371g (see FIGS. 11(B), 17).

Herein, in the second embodiment, the six source lead terminals 320 and the plurality of I/O lead terminal mounting parts 361a are formed of the lead frame 300, and the connecting conductors 372, the conductors 371a to 371g, and the I/O lead terminal connecting parts 362a are formed by plating. That is, the conductors 371a to 371g are formed by plating the source lead terminals 320a to 320f and the drain connection lead terminal 313, respectively. The I/O lead terminal connecting parts 362a are formed by plating the I/O lead terminal mounting parts 361a. Note that the conductors 371a to 371g are sometimes representatively referred to as a conductor 371 in the following description.

The drain conductors 340a to 340c are respectively connected to the conductors 371a to 371c (see also FIG. 17) and are respectively connected to the source lead terminals 320a to 320c via the conductors 371a to 371c. The drain connecting conductor 312 is connected to the conductor 371g and is connected to the drain connection lead terminal 313 via the conductor 371g.

The respective source electrodes S of the MOS FETs 110, 120 are each coupled to a source lead terminal 320 via a coupling layer 531 and a conductor 371. The respective gate electrodes G of the MOS FETs 110, 120 are each coupled to one end of a connecting conductor 372 via a coupling layer 531. The electrode 241 as one of the two electrodes 241 and 242 of the control semiconductor element 240 is coupled to another end of the connecting conductor 372 via a coupling layer 531. That is, the connecting conductors 372 held by the resin 511 connect each of the respective gate electrodes G of the MOS FETs 110, 120 with an electrode 241 as one of the two electrodes 241 and 242 of a control semiconductor element 240. The electrodes 242, 243 of the control semiconductor elements 240 are each coupled to an I/O lead terminal connecting part 362a via a coupling layer 531.

The coupling layers 531 are provided on the respective surfaces exposed from an underside surface of the resin 511 of the source lead terminals 320, the drain connection lead terminal 313, and the I/O lead terminal mounting parts 361a. The coupling layers 531 individually formed on the respective surfaces exposed from the underside surface of the resin 511 of the source lead terminals 320, the drain connection lead terminal 313, and the I/O lead terminal mounting parts 361a are individually coupled to connection pads of a circuit substrate, not shown.

As in the first embodiment, the coupling layers 531 are all formed in the same step using the pre-plated lead frame (PPF) technology.

The drain electrodes D of the MOS FETs 120a to 120c are electrically connected to the drain conductors 340a to 340c, respectively. The drain conductors 340a to 340c are coupled to the conductors 371a to 371c via the coupling layers 531, respectively. The conductors 371a to 371c are electrically connected to the source lead terminals 320a to 320c, respectively. In this way, the source electrodes S of the MOS FETs 110a to 110c are connected to the drain electrodes D of the MOS FETs 120a to 120c, respectively.

As in the first embodiment, the upper surface of the drain connecting part 342 of each drain conductor 340 is exposed from the sealing resin 521. Therefore, each drain conductor 340 functions as both a conductive body and a heatsink.

As shown in FIG. 12, the drain connecting part 312a of the drain connecting conductor 312 is electrically connected to the drain electrodes D of the MOS FETs 110a to 110c. The lead terminal connecting part 312b of the drain connecting conductor 312 is coupled to the drain connection lead terminal 313 via the coupling layer 531 and the conductor 371g. As in the first embodiment, the upper surface of the drain connecting part 312a of the drain connecting conductor 312 is exposed from the upper surface of the sealing resin 521. Therefore, the drain connecting conductor 312 functions as both a conductive body and a heatsink.

Figure 14:
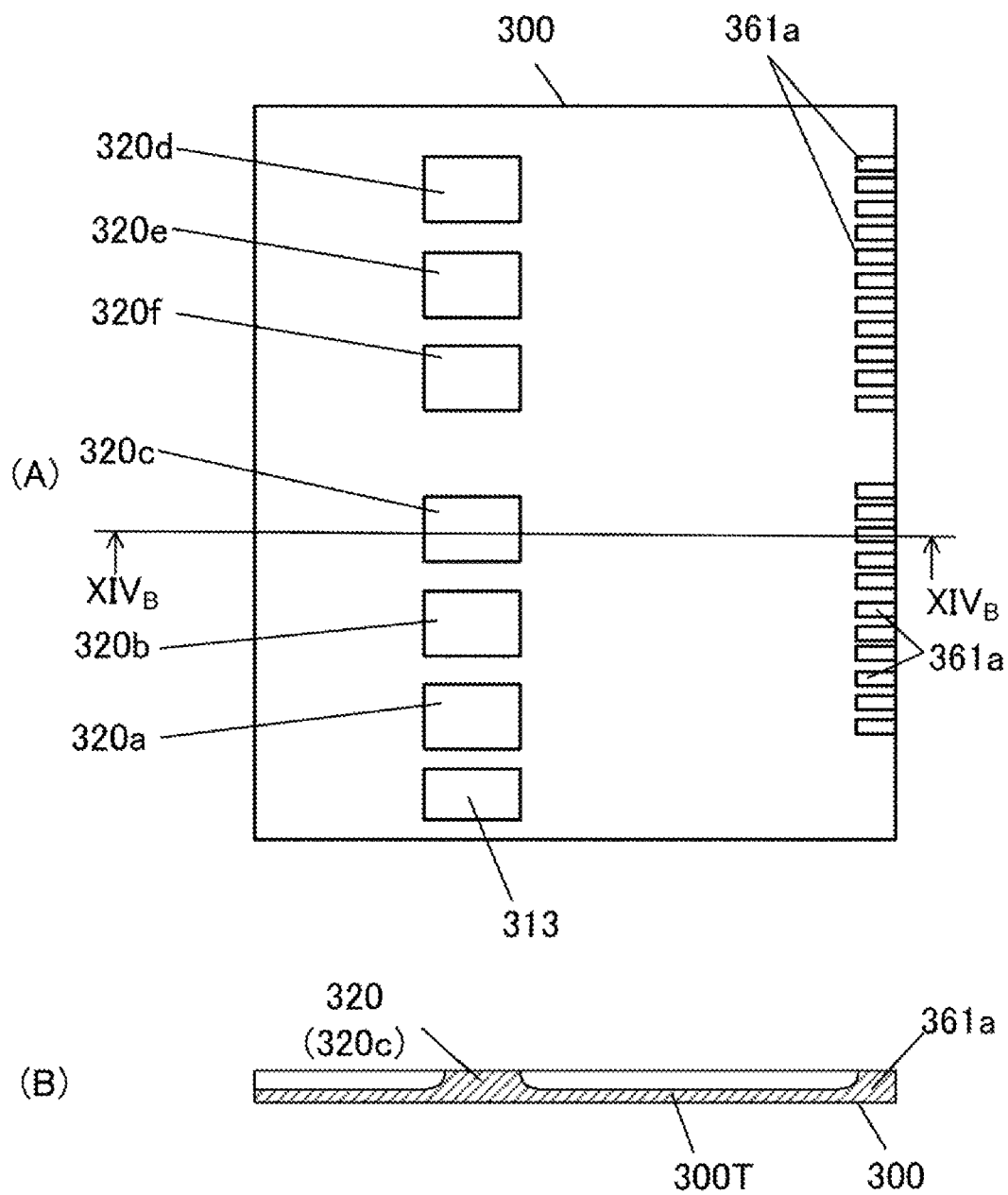
FIG. 14 shows an exemplary method for manufacture of the semiconductor device of FIG. 11, where
Figure 15:
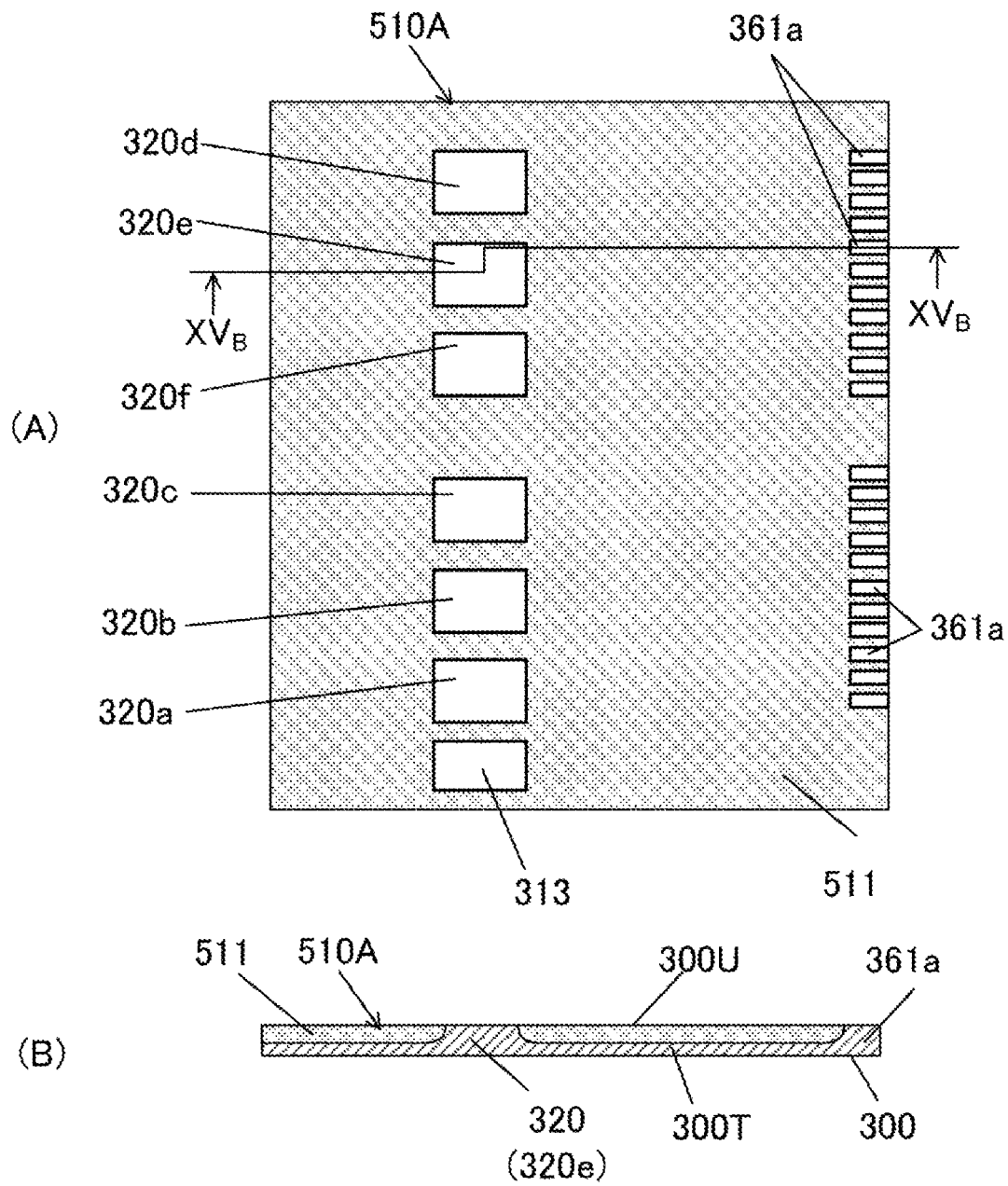
FIG. 15 shows the method for manufacture of the semiconductor device subsequent to FIG. 14, where

A method for manufacture of the semiconductor device 100A of the second embodiment will be described with reference to FIGS. 14 to 20. First, the method for manufacture of the lead terminal sealing body 510A will be described with reference to FIGS. 14 to 15. FIG. 14 shows an exemplary method for manufacture of the semiconductor device 100A of FIG. 11, where FIG. 14(A) is a top view and FIG. 14(B) is a cross-sectional view taken along line XIVB-XIVB of FIG. 14(A). FIG. 15 shows the method for manufacture of the semiconductor device 100A subsequent to FIG. 14, where FIG. 15(A) is a top view and FIG. 15(B) is a cross-sectional view taken along line XVB-XVB of FIG. 15(A).

The lead frame 300 in a form of a flat plate is provided. The lead frame 300 is made of metal with high conductivity and, for example, copper or copper alloy is a suitable material. The lead frame 300 is used to simultaneously produce many semiconductor devices 100A. However, hereinafter, the lead frame 300 is assumed to have a size of one semiconductor device 100A.

As shown in FIGS. 14(A), 14(B), the lead frame 300 is then half-etched from an upper surface side. Half etching results in formation of a lead frame thin section 300T in an area other than where the source lead terminals 320a to 320f, the drain connection lead terminal 313, and the I/O lead terminal mounting parts 361a are formed.

Next, as shown in FIGS. 15(A), 15(B), the area of the lead frame 300 where the lead frame thin section 300T is formed is filled with the resin 511 by molding such as transfer molding, for example. The area is, in other words, the area of the lead frame 300 other than the source lead terminals 320a to 320f, the drain connection lead terminal 313, and the I/O lead terminal mounting parts 361a. After the area having the lead frame thin section 300T is filled with the resin 511, the lead frame 300 and the resin 511 are preferably flattened at an upper surface side by a grinding process.

In this way, the lead terminal sealing body 510A is formed in which an upper portion of the area of the lead frame 300 having the lead frame thin section 300T is filled with the resin 511. The source lead terminals 320a to 320f, the drain connection lead terminal 313, and the I/O lead terminal mounting parts 361a are formed in the lead frame 300 of the lead terminal sealing body 510A integrally with the lead frame thin section 300T and are not separated from each other at this point.

Next, with reference to FIGS. 16 to 20, there are described steps of forming the connecting conductors 372, the conductors 371, and the I/O lead terminal connecting parts 362a on the lead terminal sealing body 510A, coupling the MOS FETs 110, 120 and the control semiconductor elements 240 to the conductors 371, the connecting conductors 372, and the I/O lead terminals 360, and sealing them with the sealing resin 521.

Figure 16:
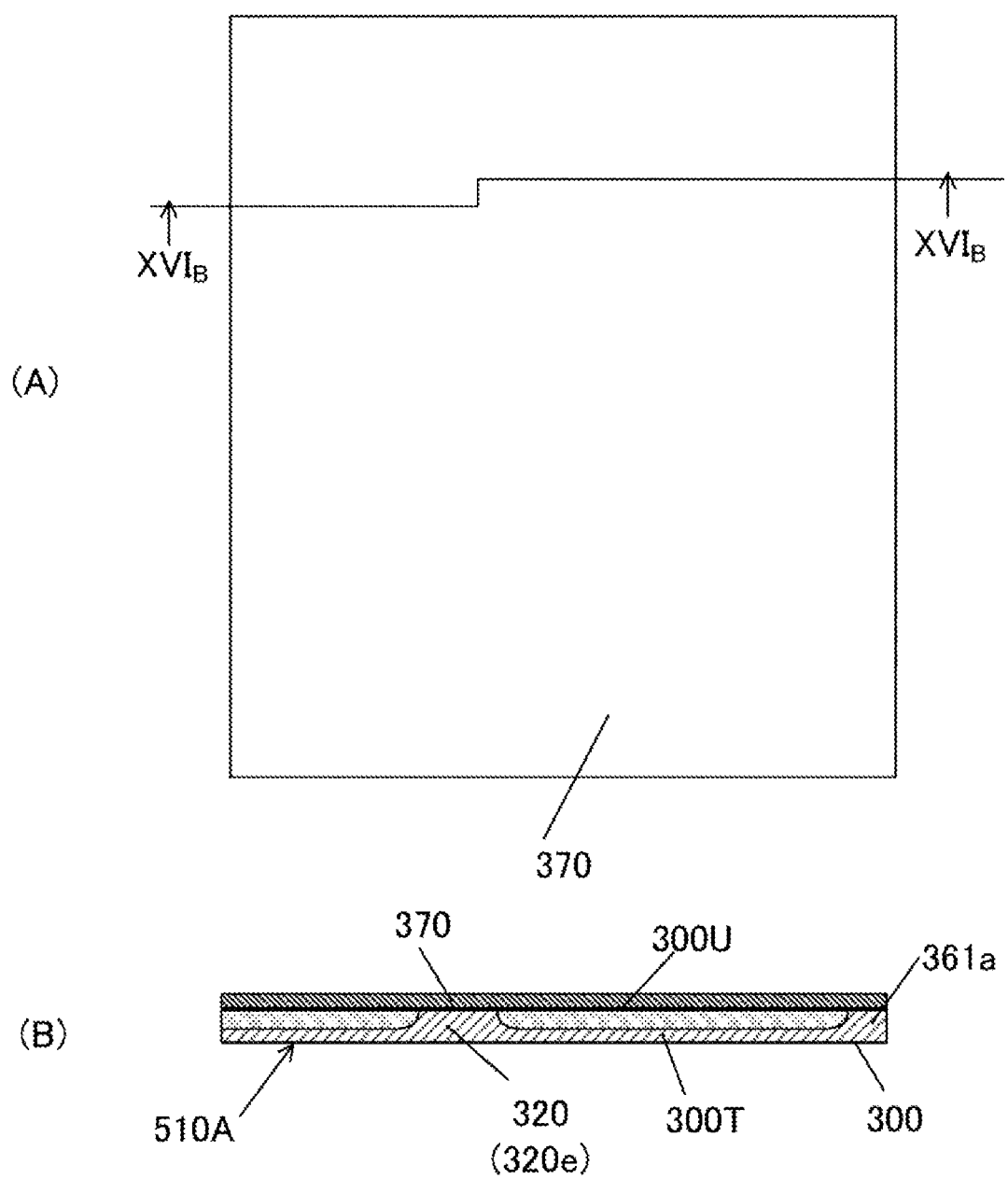
FIG. 16 shows the method for manufacture of the semiconductor device subsequent to FIG. 15, where
Figure 18:
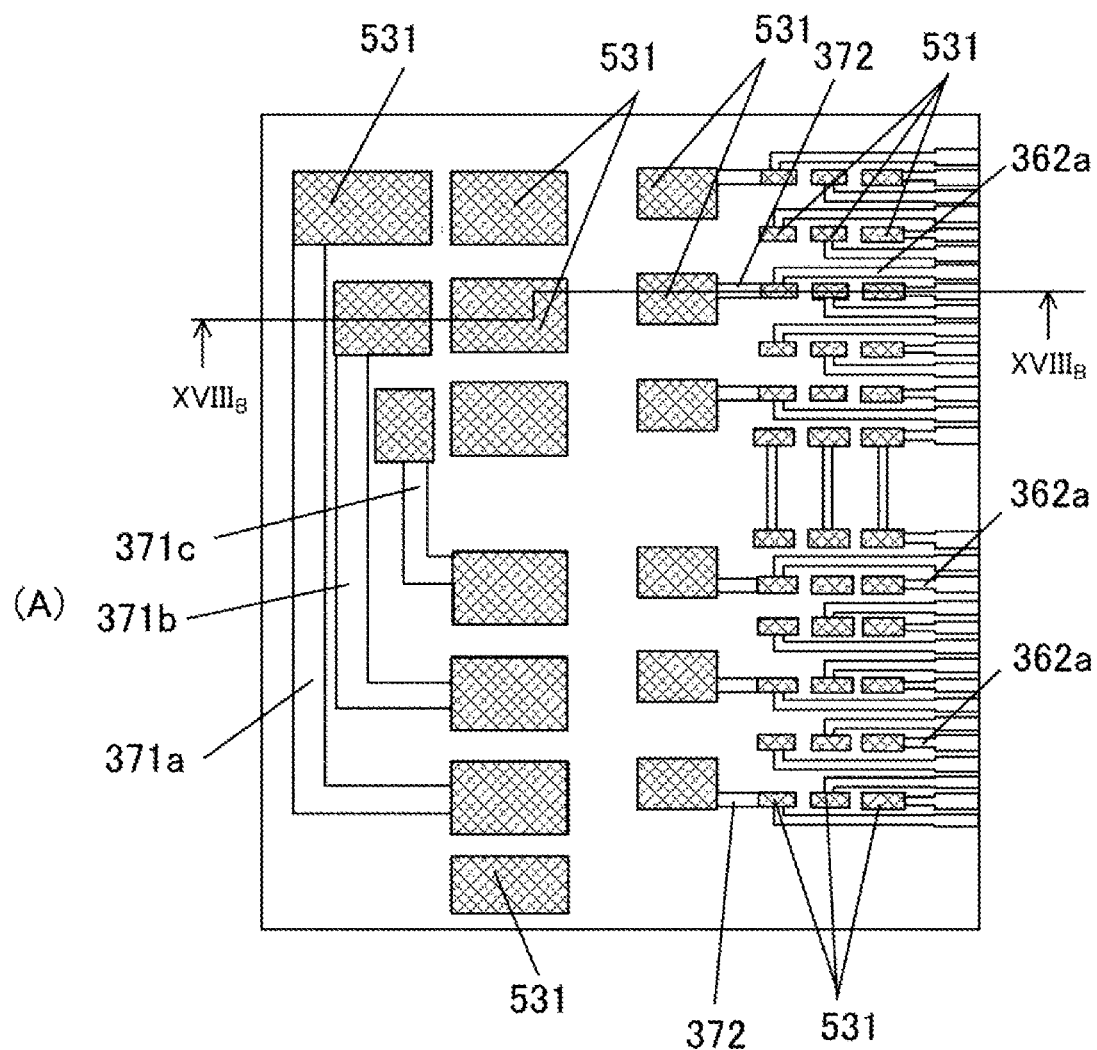
FIG. 18 shows the method for manufacture of the semiconductor device subsequent to FIG. 17, where
Figure 18:
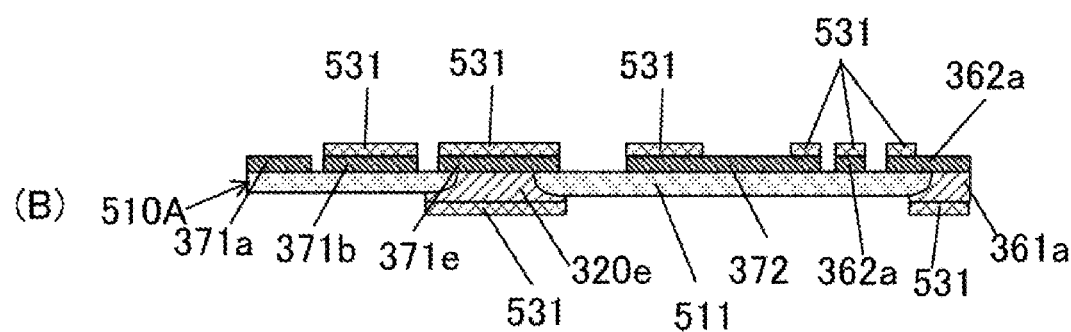

FIG. 16 shows the method for manufacture of the semiconductor device 100A subsequent to FIG. 15, where FIG. 16(A) is a top view and FIG. 16(B) is a cross-sectional view taken along line XVIB-XVIB of FIG. 16(A). FIG. 17 shows the method for manufacture of the semiconductor device 100A subsequent to FIG. 16, where FIG. 17(A) is a top view and FIG. 17(B) is a cross-sectional view taken along line XVIIB-XVIIB of FIG. 17(A). FIG. 18 shows the method for manufacture of the semiconductor device 100A subsequent to FIG. 17, where FIG. 18(A) is a top view and FIG. 18(B)

is a cross-sectional view taken along line XVIIIB-XVIIIB of FIG. 18(A). FIG. 19 shows the method for manufacture of the semiconductor device 100A subsequent to FIG. 18, where FIG. 19(A) is a top view and FIG. 19(B) is a cross-sectional view taken along line XIXB-XIXB of FIG. 19(A). FIG. 20 shows the method for manufacture of the semiconductor device 100A subsequent to FIG. 19, where FIG. 20(A) is a top view and FIG. 20(B) is a cross-sectional view taken along line XXB-XXB of FIG. 20(A).

As shown in FIGS. 16(A), (B), upper surfaces of the source lead terminals 320*a* to 320*f*, the drain connection lead terminal 313, and the I/O lead terminal mounting parts 361*a*, which are integral with the lead frame thin section 300T, and an upper surface 300U of the resin 511 (hereinafter, referred to as a conductor forming face) are flat at an upper surface side of the lead terminal sealing body 510A.

As shown in FIGS. 16(A), 16(B), a conductive film 370 is formed on the conductor forming face 300U. The conductive film 370 is appropriately formed by sputtering for formation of a foundation layer (not shown) and by electrolytic plating using the foundation layer as a current path. However, the present invention is not limited to this method and, for example, the conductive film 370 may be formed only by sputtering. Copper or copper alloy is a suitable material for the conductive film 370.

Next, as shown in FIGS. 17(A), 17(B), the conductive film 370 is patterned using the photolithography technology. Patterning the conductive film 370 results in formation of the conductors 371*a* to 371*g*, the connecting conductors 372, and the I/O lead terminal connecting parts 362*a* separated from each other. At this time, the conductor 371*g* (see FIG. 12) is also formed on the drain connection lead terminal 313. Ends 331 of the conductors 371*a* to 371*c* at a side opposite to the source lead terminals 320*a* to 320*c* are formed adjacent to the source lead terminals 320*d* to 320*f*, respectively (see FIGS. 14, 17).

Next, as shown in FIGS. 18(A), 18(B), the lead frame thin section 300T is removed so that the lower surface of the resin 511 is exposed from a lower surface of the lead terminal sealing body 510A. In this way, the source lead terminals 320*a* to 320*f*, the drain connection lead terminal 313, and the I/O lead terminal mounting parts 361*a* are separated from each other. As a result, the conductors 371*a* to 371*g*, the connecting conductors 372, and the I/O lead terminal connecting parts 362*a* are each an electrically independent circuit conductor.

Then, the respective coupling layers 531 are formed on the upper and lower surfaces of the source lead terminals 320*a* to 320*f* and the drain connection lead terminal 313, on the lower surfaces of the I/O lead terminal mounting parts 361*a*, and on upper surfaces of one end and another end of each connecting conductor 372 and one end of each I/O lead terminal connecting part 362*a*.

Next, as shown in FIGS. 19(A), 19(B), the MOS FETs 110, 120 and the control semiconductor elements 240 are coupled to the coupling layers 531 with coupling material such as solder (not shown). In more detail, the source electrodes S of the MOS FETs 110*a* to 110*c*, 120*a* to 120*c* are coupled to the coupling layers 531 formed on the source lead terminals 320*a* to 320*f*, respectively, with the coupling material (not shown). The respective gate electrodes G of the MOS FETs 110*a* to 110*c*, 120*a* to 120*c* are coupled to the coupling layers 531 each formed on one end of a connecting conductor 372 with the coupling material (not shown).

An electrode 241 of each of the control semiconductor elements 240*a*, 240*b* is coupled to a coupling layer 531 formed on an end of a connecting conductor 372 with the coupling material (not shown), and electrodes 242 and 243 are coupled to respective coupling layers 531 formed on I/O lead terminal connecting parts 362*a* with the coupling material (not shown).

Next, as shown in FIGS. 20(A), 20(B), the source connecting parts 343 of the drain conductors 340*a* to 340*c* are coupled to the coupling layers 531 formed on the ends 331 of the conductors 371*a* to 371*c*, respectively (see FIG. 17). The source connecting parts 343 of the drain conductors 340*a* to 340*c* are coupled to the ends 331 of the conductors 371*a* to 371*c* such that the drain connecting parts 342 of the drain conductors 340*a* to 340*c* are electrically connected to the drain electrodes D of the MOS FETs 120*a* to 120*c*, respectively. In this way, the drain electrodes D of the MOS FETs 120*a* to 120*c* are connected to the source electrodes S of the MOS FETs 110*a* to 110*c*, respectively.

The lead terminal connecting part 312*b* of the drain connecting conductor 312 is coupled to the coupling layer 531 formed on the drain connection lead terminal 313 (see FIG. 12). The lead terminal connecting part 312*b* of the drain connecting conductor 312 is coupled to the drain connection lead terminal 313 such that the lead terminal connecting part 312*b* of the drain connecting conductor 312 is electrically connected to the drain electrodes D of the MOS FETs 110*a* to 110*c*.

Then, an upper surface of the lead terminal sealing body 510A, and the MOS FETs 110, 120, the control semiconductor elements 240, the drain conductors 340, and the drain connecting conductor 312 provided on the upper surface of the lead terminal sealing body 510A are sealed with the sealing resin 521. In this way, there can be provided the semiconductor device 100A of FIGS. 11(A), (B), and 12.

Also in the second embodiment, the semiconductor device 100A includes the resin 511 with which the source lead terminal 320 and the I/O lead terminal mounting part 361*a* are sealed, and the sealing resin 521 with which the MOS FET 110 and the control semiconductor element 240 are sealed. Therefore, also in the second embodiment, the advantageous effect similar to that of (1) in the first embodiment can be achieved.

In the second embodiment, the semiconductor device 100A includes the connecting conductor 372 held by the resin 511, the MOS FET 110 includes the gate electrode G, the control semiconductor element 240 includes the electrode 241, and the gate electrode G of the MOS FET 110 and the electrode 241 of the control semiconductor element 240 are each connected to the connecting conductor 372. Therefore, also in the second embodiment, the advantageous effect similar to that of (2) in the first embodiment can be achieved.

In the second embodiment, the source lead terminal 320 and the I/O lead terminal mounting part 361*a* are formed of the lead frame 300, and the connecting conductor 372 is formed by plating to be thinner than the lead frame 300. Therefore, in the second embodiment, the advantageous effect similar to that of (3) in the first embodiment can be achieved.

Since being formed by plating in the second embodiment, the connecting conductor 372 can be further thinner and more refined than the connecting conductor formed of the lead frame. Therefore, in the second embodiment, the connecting conductor 372 can be further finer.

Also in the second embodiment, the source lead terminal 320 is connected to the high potential part, and the I/O lead terminal mounting part 361*a* is connected to the low potential part. The gate electrode G of the MOS FET 110 and the electrode 241 of the control semiconductor element 240 are arranged between the source electrode S of the MOS FET 110 coupled to the source lead terminal 320 and the electrode 242 of the control semiconductor element 240 coupled to the I/O lead terminal mounting part 361a. Therefore, also in the second embodiment, the advantageous effect similar to that of (4) in the first embodiment can be achieved.

Also in the second embodiment, the source lead terminal 320, the I/O lead terminal mounting part 361a, and the connecting conductor 372 include copper or copper alloy. Therefore, also in the second embodiment, the advantageous effect similar to that of (5) in the first embodiment can be achieved.

Also in the second embodiment, the MOS FET 120 has the drain electrode D on a surface at a side opposite to a side where the source electrode S and the gate electrode G are arranged, and the semiconductor device 100A further includes the drain conductor 340 (conductive body) connected to the drain electrode D. Therefore, also in the second embodiment, the advantageous effect similar to that of (6) in the first embodiment can be achieved.

Also in the second embodiment, the MOS FET 120 has the drain electrode D on the surface at the side opposite to the side where the source electrode S and the gate electrode G are arranged, further the drain conductor 340 connected to the drain electrode D is provided, and the drain conductor 340 has the upper surface at a side opposite to a side where the MOS FET 120 is arranged, the upper surface being exposed from the sealing resin 521. Therefore, also in the second embodiment, the advantageous effect similar to that of (7) in the first embodiment can be achieved.

Also in the second embodiment, the method for manufacture of the semiconductor device 100A includes step for forming the coupling layers 531 (coupling plating layers) on the upper and lower surfaces of the source lead terminal 320, on the upper surface of one end of the I/O lead terminal connecting part 362a, and on the lower surface of the I/O lead terminal mounting part 361a, before coupling the source electrode S of the MOS FET 110, 120 to the conductor 371 on the source lead terminal 320 of the lead terminal sealing body 510A and before coupling the electrode 242, 243 of the control semiconductor element 240 to the I/O lead terminal connecting part 362a on the I/O lead terminal mounting part 361a of the lead terminal sealing body 510A. Therefore, also in the second embodiment, the advantageous effect similar to that of (8) in the first embodiment can be achieved.

In the above embodiments, the MOS FETs 110, 120 are illustrated as the switching elements constituting the inverter circuit 130 that is the power converter of the semiconductor device 100, 100A. However, the switching element is not limited to the MOS FETs 110, 120 and may be another semiconductor element such as an insulated gate bipolar transistor (IGBT), for example. When the IGBT is used as the switching element of the power converter, a diode is required to be arranged between an emitter and a collector.

In the above embodiments, the semiconductor device 100, 100A is illustrated as having the six-in-one structure where the six arm circuits are packaged into one body. However, the present invention is applicable to all semiconductor devices having at least one arm circuit.

In the above embodiments, the semiconductor device 100, 100A is illustrated as having the inverter circuit that converts a direct current (DC) to an alternative current (AC). However, the present invention is applicable to semiconductor devices having a converter that performs AC/DC conversion or a power converter that performs DC/DC conversion. Furthermore, the present invention is also applicable to a package without the power converter and, in short, is widely applicable to semiconductor devices having a plurality of semiconductor elements sealed with a sealing resin.

In the above embodiments, a case is described where the coupling layers 531 are formed by simultaneously plating the upper and lower surfaces of the lead terminal sealing body 510, 510A. However, the upper surface and the lower surface may be plated with respective different types of metal. For example, in the first embodiment, a method may be taken in which the coupling layers 531 are formed on the respective upper surfaces of the source lead terminals 320a to 320f and the drain connection lead terminal 313, at one end and another end of each connecting conductor 350, and at one end of each connecting part 362 of the I/O lead terminals 360, then the sealing resin 521 is formed, and thereafter plating with metal different from that used for the upper surfaces is applied on the respective lower surfaces of the source lead terminals 320a to 320f and the drain connection lead terminal 313 and on the lower surfaces of the mounting parts 361 of the I/O lead terminals 360. For example, the upper surfaces may be plated with Ag, and the lower surfaces may be plated with Sn or Sn—Ag alloy. The similar steps are applicable in the second embodiment.

The various embodiments have been described above, but the present invention is not limited to the details thereof. Another mode conceivable within the technical idea of the present invention also falls within the scope of the present invention.

The semiconductor device described in Patent Literature 1 has the structure where one electrode of each of the two MOS FETs and one electrode of the driver IC are coupled to lead terminals formed of the lead frame and another electrode of each MOS FET is coupled to another lead terminal by a bonding wire. The two MOS FETs, the driver IC, the lead terminals, and the bonding wires are sealed with the resin in a lump. Each lead terminal has a surface exposed from the resin at a side opposite to the coupling face. Coupling the surfaces of the lead terminals exposed from the resin individually to connection pads of a circuit substrate leads to achievement of high-density mounting.

However, before the resin sealing, the lead frame is required to be cut by etching for the lead terminals to be separated from each other in the state where one electrode of each MOS FET and one electrode of the driver IC are coupled to the lead frame and another electrode of each MOS FET is connected to the lead frame by a bonding wire. Etching the lead frame, which requires the MOS FETs, the driver IC, and the bonding wires to be masked in advance, takes time and entails a risk of breakage of the bonding wire or the like. Furthermore, molding is to be performed in a state where the lead terminals are connected with each other only by the bonding wires and are held by no member, and thus requires accurate positioning in a mold and a device as well to prevent the lead terminals from stirring due to resin injection pressure. Such an issue makes it difficult to enhance the productivity of the semiconductor device described in Patent Literature 1. However, the semiconductor device according to the above-described embodiments has no such an issue. Therefore, the productivity thereof can be enhanced.

The present application claims the benefit of Japanese patent application No. 2019-103206, filed on May 31, 2019, the content of which is incorporated herein by reference.

REFERENCE SIGNS LIST 100, 100A: semiconductor device
110, 110a to 110c: MOS FET 120, 120a to 120c: MOS FET
240, 240a, 240b: control semiconductor element
241: electrode
242, 243: electrode
300: lead frame
300S: lead frame thinned part
300T: lead frame thin section
300U: conductor forming face
312: drain connecting conductor
313: drain connection lead terminal
320, 320a to 320f: source lead terminal
330, 330a to 330c: routing conductor
340, 340a to 340c: drain conductor
350: connecting conductor
360: I/O lead terminal
361: mounting part
361a: I/O lead terminal mounting part
362: connecting part
362a: I/O lead terminal connecting part
372: connecting conductor
371, 371a to 371g: conductor
400: motor generator
510, 510a: lead terminal sealing body
511: resin
521: sealing resin
531: coupling layer
D: drain electrode
S: source electrode
G: gate electrode

The invention claimed is:

1. A semiconductor device comprising:
at least one first semiconductor element, each having a first electrode;
a second semiconductor element having a second electrode;
a first lead terminal connected to the first electrode of the at least one first semiconductor element;
a second lead terminal connected to the second electrode of the second semiconductor element;
a first resin with which the first lead terminal and the second lead terminal are held;
a second resin with which the at least one first semiconductor element and the second semiconductor element are sealed; and
a connecting conductor held by the first resin,
wherein the at least one first semiconductor element has a third electrode,
wherein the second semiconductor element has a fourth electrode, and
wherein the third electrode of the at least one first semiconductor element and the fourth electrode of the second semiconductor element are each connected to the connecting conductor,
wherein the first lead terminal and the second lead terminal each have a lower surface at a side opposite to a side where the at least one first semiconductor element and the second semiconductor element are arranged, at least a portion of each of the lower surfaces being exposed from the first resin,
wherein the first electrode and the third electrode of the first semiconductor element are arranged at a lower side of the first semiconductor element facing the first resin, and
wherein the second electrode and the fourth electrode of the second semiconductor element are arranged at a lower side of the second semiconductor element facing the first resin.

2. The semiconductor device according to claim 1,
wherein the first lead terminal, the second lead terminal, and the connecting conductor are formed of a lead frame, and
wherein the connecting conductor is thinner than the first lead terminal.

3. The semiconductor device according to claim 1,
wherein the first lead terminal and the second lead terminal are formed of a lead frame, and
wherein the connecting conductor is formed by plating.

4. The semiconductor device according to claim 1,
wherein the first lead terminal is connected to a high potential part,
wherein the second lead terminal is connected to a low potential part, and
wherein the third electrode of the at least one first semiconductor element and the fourth electrode of the second semiconductor element are arranged between the first electrode of the at least one first semiconductor element coupled to the first lead terminal and the second electrode of the second semiconductor element coupled to the second lead terminal.

5. The semiconductor device according to claim 4,
wherein the second lead terminal includes a connecting part coupled to the second electrode of the second semiconductor element and a mounting part exposed from the first resin, and
wherein the connecting part is thinner than the mounting part.

6. The semiconductor device according to claim 1, wherein the first lead terminal, the second lead terminal, and the connecting conductor include copper or copper alloy.

7. The semiconductor device according to claim 1, wherein coupling plating layers formed of the same material are individually provided between the first electrode of the at least one first semiconductor element and the first lead terminal, between the second electrode of the second semiconductor element and the second lead terminal, on a surface of the first lead terminal at a side opposite to a side where the first electrode of the at least one first semiconductor element is arranged, and on a surface of the second lead terminal at a side opposite to a side where the second electrode of the second semiconductor element is arranged.

8. The semiconductor device according to claim 1, wherein a first coupling plating layer is provided between the first electrode of the at least one first semiconductor element and the first lead terminal and between the second electrode of the second semiconductor element and the second lead terminal, and a second coupling plating layer formed of different metal than the first coupling plating layer is provided on a surface of the first lead terminal at a side opposite to a side where the first electrode of the at least one first semiconductor element is arranged and on a surface of the second lead terminal at a side opposite to a side where the second electrode of the second semiconductor element is arranged.

9. The semiconductor device according to claim 1, further comprising:
a conductive body,
wherein the at least one first semiconductor element each has a fifth electrode at a side opposite to a side where the first electrode and the third electrode are arranged, and
wherein the conductive body is connected to the fifth electrode.

10. The semiconductor device according to claim 9, wherein the conductive body has an upper surface exposed from the second resin at a side opposite to a side where the at least one first semiconductor element is arranged.

11. The semiconductor device according to claim 9,
wherein the at least one first semiconductor element includes at least one pair of semiconductor elements, and
wherein the conductive body connects the fifth electrode of one of the at least one pair of semiconductor elements with the first electrode of the other of the at least one pair of semiconductor elements.

12. The semiconductor device according to claim 11, wherein the at least one pair of semiconductor elements includes a plurality of pairs of semiconductor elements.

13. The semiconductor device according to claim 12, further comprising:
a power converter configured to perform conversion of a direct current or an alternate current, wherein
the second semiconductor element is a control semiconductor element configured to control driving of the plurality of pairs of semiconductor elements, and
the plurality of pairs of semiconductor elements and the control semiconductor element constitute the power converter.

14. A method for manufacture of a semiconductor device, comprising:
forming a lead terminal sealing body in which a first lead terminal and a second lead terminal are held by a first resin;
connecting a first electrode of a first semiconductor element with the first lead terminal of the lead terminal sealing body;
connecting a second electrode of a second semiconductor element with the second lead terminal of the lead terminal sealing body; and
sealing with a second resin the first semiconductor element, the second semiconductor element, and a surface of the lead terminal sealing body at a first and second semiconductor element side,
wherein the connecting conductor connects a third electrode of the first semiconductor element with a fourth electrode of the second semiconductor element,
wherein the first lead terminal, the second lead terminal, and the connecting conductor are formed of a lead frame,
wherein the connecting conductor is thinner than the first lead terminal,
wherein the first lead terminal and the second lead terminal each have a lower surface at a side opposite to a side where the at least one first semiconductor element and the second semiconductor element are arranged, at least a portion of the lower surface of the first lead terminal being exposed from the first resin,
wherein the first electrode and the third electrode of the first semiconductor element are arranged at a lower side of the first semiconductor element facing the first resin, and
wherein the second electrode and the fourth electrode of the second semiconductor element are arranged at a lower side of the second semiconductor element facing the first resin.

15. The method for manufacture of a semiconductor device according to claim 14, wherein the first lead terminal, the second lead terminal, and the connecting conductor are formed of a lead frame.

16. The method for manufacture of a semiconductor device according to claim 14, further comprising:
forming the connecting conductor by plating,
wherein the first lead terminal and the second lead terminal are formed of a lead frame.

17. The method for manufacture of a semiconductor device according to claim 14, further comprising:
forming coupling plating layers on both upper and lower surfaces of the first lead terminal and on both upper and lower surfaces of the second lead terminal before coupling the first electrode of the first semiconductor element to the first lead terminal of the lead terminal sealing body and before coupling the second electrode of the second semiconductor element to the second lead terminal of the lead terminal sealing body, wherein
an upper surface of the upper and lower surfaces of the first lead terminal is a surface to which the first electrode of the first semiconductor element is coupled, at a side opposite to a lower surface of the upper and lower surfaces of the first lead terminal, and
an upper surface of the upper and lower surfaces of the second lead terminal is a surface to which the second electrode of the second semiconductor element is coupled, at a side opposite to a lower surface of the upper and lower surfaces of the second lead terminal.

* * * * *